US010193017B2

(12) United States Patent
Kim et al.

(10) Patent No.: US 10,193,017 B2
(45) Date of Patent: Jan. 29, 2019

(54) LIGHT EMITTING DIODE

(71) Applicant: SEOUL VIOSYS CO., LTD., Ansan-si (KR)

(72) Inventors: Mae Yi Kim, Ansan-si (KR); Jin Woong Lee, Ansan-si (KR); Yeo Jin Yoon, Ansan-si (KR); Seom Geun Lee, Ansan-si (KR); Yong Woo Ryu, Ansan-si (KR); Keum Ju Lee, Ansan-si (KR)

(73) Assignee: SEOUL VIOSYS CO., LTD., Ansan-si (KR)

( * ) Notice: Subject to any disclaimer, the term of this patent is extended or adjusted under 35 U.S.C. 154(b) by 0 days.

(21) Appl. No.: 15/905,224

(22) Filed: Feb. 26, 2018

(65) Prior Publication Data

US 2018/0190864 A1 Jul. 5, 2018

Related U.S. Application Data

(63) Continuation of application No. 15/354,928, filed on Nov. 17, 2016, now Pat. No. 9,905,729, which is a
(Continued)

(30) Foreign Application Priority Data

Mar. 27, 2015 (KR) .................. 10-2015-0043219
Mar. 15, 2016 (KR) .................. 10-2016-0030807
Sep. 27, 2016 (KR) .................. 10-2016-0123990

(51) Int. Cl.
*H01L 33/38* (2010.01)
*H01L 33/62* (2010.01)
(Continued)

(52) U.S. Cl.
CPC ............ *H01L 33/145* (2013.01); *H01L 33/32* (2013.01); *H01L 33/38* (2013.01); *H01L 33/42* (2013.01); *H01L 33/62* (2013.01); *H01L 33/20* (2013.01)

(58) Field of Classification Search
CPC ........ H01L 33/00–33/648; H01L 33/02; H01L 33/08; H01L 33/14; H01L 33/145;
(Continued)

(56) References Cited

U.S. PATENT DOCUMENTS

D681,559 S * 5/2013 Shen .......................... D13/180
D681,560 S * 5/2013 Shen .......................... D13/180
(Continued)

FOREIGN PATENT DOCUMENTS

JP 2011-061077 A 3/2011
JP 5547039 B2 7/2014
(Continued)

OTHER PUBLICATIONS

International Search Report in International Application No. PCT/KR2016/002631, dated Jun. 15, 2016.
(Continued)

*Primary Examiner* — Maliheh Malek
(74) *Attorney, Agent, or Firm* — Perkins Coie LLP

(57) ABSTRACT

A light emitting diode includes a substrate that has an elongated rectangular shape in one direction; a light emitting structure positioned on the substrate and having an opening for exposing a first conductive semiconductor layer; a first electrode pad disposed to be closer to a first corner of the substrate; a second electrode pad disposed to be relatively closer to a second corner of the substrate opposing to the first corner; a first extension extending from the first electrode pad; and a second extension and a third extension extending from the second electrode pad to sides of the first extension,
(Continued)

wherein an imaginary line connecting an end of the second extension and an end of the third extension is located between the first electrode pad and the first corner.

21 Claims, 20 Drawing Sheets

Related U.S. Application Data continuation-in-part of application No. PCT/KR2016/002631, filed on Mar. 17, 2016.

(51) Int. Cl.
*H01L 33/14* (2010.01)
*H01L 33/42* (2010.01)
*H01L 33/32* (2010.01)
*H01L 33/20* (2010.01)

(58) Field of Classification Search
CPC ......... H01L 33/20; H01L 33/22; H01L 33/24; H01L 33/26; H01L 33/30–33/32; H01L 33/148; H01L 33/36–33/387
See application file for complete search history.

(56) References Cited

U.S. PATENT DOCUMENTS

| | | | |
|---|---|---|---|
| D681,569 S * | 5/2013 | Yeh | D13/180 |
| D681,570 S * | 5/2013 | Wang | D13/180 |
| D684,550 S * | 6/2013 | Yeh | D13/180 |
| D687,396 S * | 8/2013 | Chen | D13/180 |
| 8,552,447 B2 * | 10/2013 | Yahata | H01L 33/46 257/82 |
| D697,490 S * | 1/2014 | Yeh | D13/180 |
| D716,238 S * | 10/2014 | Yeh | D13/180 |
| D728,494 S * | 5/2015 | Yeh | D13/180 |
| 9,093,627 B2 | 7/2015 | Lee | |
| D748,592 S * | 2/2016 | Yeh | D13/180 |
| 9,324,691 B2 * | 4/2016 | Jing | H01L 25/0753 |
| 9,356,212 B2 | 5/2016 | Oh | |
| 9,401,456 B2 | 7/2016 | Lee | |
| 9,406,844 B2 * | 8/2016 | Choi | H01L 33/20 |
| D770,101 S | 10/2016 | Kim | |
| 9,472,724 B2 * | 10/2016 | Emura | H01L 33/38 |
| D770,401 S * | 11/2016 | Kim | D13/180 |
| D770,989 S | 11/2016 | Kim | |
| 9,508,902 B2 * | 11/2016 | Ko | H01L 33/14 |
| 9,515,121 B2 | 12/2016 | Oh | |
| 9,520,536 B2 * | 12/2016 | Kim | H01L 33/20 |
| D782,426 S * | 3/2017 | Yeh | D13/180 |
| D782,427 S * | 3/2017 | Yeh | D13/180 |
| D782,428 S | 3/2017 | Tsai | |
| 9,601,674 B2 * | 3/2017 | Yeh | H01L 27/156 |
| 9,653,515 B2 | 5/2017 | Yoon | |
| 9,680,060 B2 | 6/2017 | Kim | |
| D797,689 S * | 9/2017 | Yeh | D13/180 |
| 9,768,227 B2 | 9/2017 | Ou | |
| D808,913 S * | 1/2018 | Yeh | D13/180 |
| 9,865,775 B2 * | 1/2018 | Suh | H01L 33/145 |
| D810,704 S * | 2/2018 | Yeh | D13/180 |
| 2005/0224823 A1 | 10/2005 | Zhao | |
| 2008/0142821 A1 | 6/2008 | Sakamoto | |
| 2008/0185606 A1 * | 8/2008 | Sano | H01L 33/42 257/98 |
| 2008/0258158 A1 * | 10/2008 | Yoneda | H01L 25/0753 257/88 |
| 2009/0140280 A1 | 6/2009 | Shen | |
| 2009/0159909 A1 | 6/2009 | Lee | |
| 2009/0179215 A1 * | 7/2009 | Matsui | H01L 33/40 257/98 |
| 2009/0283787 A1 | 11/2009 | Donofrio | |
| 2009/0322241 A1 * | 12/2009 | Onushkin | H01L 27/156 315/250 |
| 2010/0044744 A1 | 2/2010 | Kim | |
| 2010/0140656 A1 * | 6/2010 | Kim | H01L 33/38 257/99 |
| 2010/0258824 A1 * | 10/2010 | Wang | H01L 33/38 257/91 |
| 2011/0114990 A1 | 5/2011 | Kim | |
| 2011/0140160 A1 | 6/2011 | Kim | |
| 2011/0147784 A1 * | 6/2011 | Brockley | H01L 33/38 257/99 |
| 2011/0156070 A1 | 6/2011 | Yoon | |
| 2011/0163346 A1 * | 7/2011 | Seo | H01L 33/08 257/99 |
| 2011/0210345 A1 * | 9/2011 | Lim | H01L 33/20 257/88 |
| 2011/0215363 A1 * | 9/2011 | Kimura | H01L 33/36 257/99 |
| 2011/0278631 A1 | 11/2011 | Shen | |
| 2011/0278634 A1 * | 11/2011 | Na | H01L 33/38 257/99 |
| 2012/0025244 A1 | 2/2012 | Suh | |
| 2012/0049223 A1 | 3/2012 | Yang | |
| 2012/0228651 A1 * | 9/2012 | Horng | H01L 25/0753 257/93 |
| 2012/0241808 A1 * | 9/2012 | Akiyama | H01L 33/22 257/99 |
| 2012/0326171 A1 | 12/2012 | Lee | |
| 2013/0020552 A1 | 1/2013 | Kazama | |
| 2013/0032815 A1 | 2/2013 | Hung | |
| 2013/0134867 A1 | 5/2013 | Yang | |
| 2013/0234172 A1 | 9/2013 | Yeh | |
| 2013/0234192 A1 | 9/2013 | Kim | |
| 2014/0034976 A1 | 2/2014 | Chu | |
| 2014/0131657 A1 * | 5/2014 | Kim | H01L 33/06 257/13 |
| 2014/0131731 A1 | 5/2014 | Kim | |
| 2014/0145218 A1 | 5/2014 | Kim | |
| 2014/0175465 A1 | 6/2014 | Lee | |
| 2014/0175503 A1 | 6/2014 | Hwang | |
| 2014/0183564 A1 | 7/2014 | Sato | |
| 2014/0231748 A1 | 8/2014 | Kim | |
| 2014/0231852 A1 | 8/2014 | Suh | |
| 2014/0231859 A1 | 8/2014 | Kim | |
| 2014/0353692 A1 | 12/2014 | Oh | |
| 2014/0367722 A1 | 12/2014 | Im | |
| 2015/0034996 A1 * | 2/2015 | Chao | H01L 33/62 257/99 |
| 2015/0076536 A1 * | 3/2015 | Ou | H01L 27/15 257/91 |
| 2015/0091041 A1 | 4/2015 | Yoon | |
| 2015/0108527 A1 | 4/2015 | Hsieh | |
| 2015/0146426 A1 | 5/2015 | Yeh | |
| 2015/0162376 A1 | 6/2015 | Yoon | |
| 2015/0162499 A1 * | 6/2015 | Sato | H01L 33/387 257/99 |
| 2015/0207051 A1 | 7/2015 | Yoon | |
| 2015/0236215 A1 * | 8/2015 | Park | H01L 33/46 257/98 |
| 2015/0236216 A1 * | 8/2015 | Kim | H01L 33/46 257/98 |
| 2015/0243706 A1 | 8/2015 | Oh | |
| 2015/0280074 A1 | 10/2015 | Lee | |
| 2016/0005917 A1 | 1/2016 | Jung | |
| 2016/0043280 A1 | 2/2016 | Moon | |
| 2016/0118564 A1 | 4/2016 | Kim | |
| 2016/0126413 A1 | 5/2016 | Kim | |
| 2016/0141454 A1 | 5/2016 | Wang | |
| 2016/0181477 A1 | 6/2016 | Lee | |
| 2016/0211410 A1 * | 7/2016 | Jang | H01L 27/153 |
| 2016/0276541 A1 | 9/2016 | Yang | |
| 2017/0047483 A1 * | 2/2017 | Kim | H01L 33/20 |
| 2017/0047494 A1 * | 2/2017 | Yeh | H01L 27/156 |
| 2017/0077355 A1 | 3/2017 | Lee | |
| 2017/0110629 A1 | 4/2017 | Suh | |
| 2017/0125640 A1 * | 5/2017 | Kim | H01L 33/44 |
| 2017/0117442 A1 | 7/2017 | Sato | |
| 2017/0207368 A1 | 7/2017 | Chen | |
| 2017/0236865 A1 * | 8/2017 | Kim | H01L 27/153 257/93 |

(56) References Cited

U.S. PATENT DOCUMENTS

| | | | |
|---|---|---|---|
| 2017/0263674 A1* | 9/2017 | Yang | H01L 25/0753 |
| 2017/0263818 A1* | 9/2017 | Ou | H01L 33/36 |
| 2018/0108704 A1* | 4/2018 | Jang | H01L 27/153 |
| 2018/0138370 A1* | 5/2018 | Shin | H01L 33/20 |
| 2018/0212123 A1* | 7/2018 | Chang | H01L 33/62 |

FOREIGN PATENT DOCUMENTS

| | | | |
|---|---|---|---|
| JP | 2014-225539 A | 12/2014 | |
| KR | 10-2013-0017154 | 2/2013 | |
| KR | 10-2014-0086184 A | 7/2014 | |

OTHER PUBLICATIONS

Office Action in Korean Patent Application No. 10-2016-0030807, dated Feb. 24, 2017 (with English translation).

\* cited by examiner (a)

(b)

(a)

(b)

LIGHT EMITTING DIODE

CROSS-REFERENCES TO RELATED APPLICATIONS

This patent document is a continuation of U.S. patent application Ser. No. 15/354,928, filed on Nov. 17, 2016, which is a continuation-in-part application of and claims priorities to, and benefits of International Patent Application No. PCT/KR2016/002631, filed on Mar. 17, 2016, which claims priority to Korean Patent Application No. 10-2015-0043219, filed on Mar. 27, 2015, and Korean Patent Application No. 10-2016-0030807, filed on Mar. 15, 2016, and further claims priority to Korean Patent Application No. 10-2016-0123990, filed on Sep. 27, 2016, which are hereby incorporated by reference for all purposes as if fully set forth herein.

BACKGROUND

Exemplary embodiments of the present disclosure relate to a light emitting diode including a light emitting diode that includes electrode extensions for current spreading.

A GaN-based light emitting diode is applied to various fields including full color LED display devices, LED traffic signals, white LEDs, and the like.

A GaN-based light emitting diode is generally formed by growing epitaxial layers on a substrate such as a sapphire substrate, and includes an n-type semiconductor layer, a p-type semiconductor layer and an active layer interposed therebetween. In addition, an n-type electrode pad is formed on the n-type semiconductor layer and a p-type electrode pad is formed on the p-type semiconductor layer. The light emitting diode is electrically connected to an external power source through such electrode pads. Here, electric current flows from the p-type electrode pad to the n-type electrode pad through the semiconductor layers.

Generally, the p-type semiconductor layer has high specific resistance, causing uneven current spreading in the p-type semiconductor layer. As a result, current crowding can occur under the p-type electrode pad or on a side surface of the light emitting diode through corners or edges of the light emitting diode instead of flowing through an inner region thereof. Such current crowding results in reduction in luminous area, thereby causing deterioration in luminous efficacy. Thus, a transparent electrode layer having low specific resistance is formed on the p-type semiconductor layer in order to achieve current spreading. The transparent electrode layer having low specific resistance serves to spread electric current flowing from the p-type electrode pad before the electric current flows into the p-type semiconductor layer, thereby increasing the luminous area of the light emitting diode.

However, since the transparent electrode layer absorbs light, the transparent electrode layer is grown to a limited thickness and thus has a limitation in current spreading. Particularly, a light emitting diode having a large area of about 1 mm or more and generally used for high power output has a limitation in current spreading through the transparent electrode layer.

Moreover, since electric current flows to the n-type electrode pad through the semiconductor layers, current crowding is likely to occur in a region of the n-type semiconductor layer in which the n-type electrode pad is formed. This means that electric current flowing through the semiconductor layers crowds near the n-type electrode pad. Therefore, there is a need for solving the problem of current crowding in the n-type semiconductor layer.

SUMMARY

Exemplary embodiments of the present disclosure provide a light emitting diode that can achieve uniform current spreading while preventing reduction in luminous area.

Exemplary embodiments of the present disclosure provide a light emitting diode that can prevent current crowding through corners or edges of the light emitting diode.

Exemplary embodiments of the present disclosure provide a light emitting diode that includes a plurality of light emitting cells connected to each other in series and has improved current spreading performance.

An exemplary embodiment of the present disclosure provides a light emitting diode including: a substrate having a rectangular shape elongated in one direction; a light emitting structure including a first conductive type semiconductor layer disposed on the substrate, a second conductive type semiconductor layer disposed on the first conductive type semiconductor layer, and an active layer interposed between the first conductive type semiconductor layer and the second conductive type semiconductor layer, the light emitting structure having an opening formed through the second conductive type semiconductor layer and the active layer to expose the first conductive type semiconductor layer; a first electrode pad disposed on the first conductive type semiconductor layer in the opening to be closer to a first corner of the substrate than other corners thereof; a second electrode pad disposed on the second conductive type semiconductor layer to be relatively close to a second corner of the substrate facing the first corner; a first extension extending from the first electrode pad; and a second extension and a third extension extending from the second electrode pad to both sides of the first extension. The opening is surrounded by the second conductive type semiconductor layer and the active layer and an imaginary line connecting a distal end of the second extension to a distal end of the third extension is placed between the first electrode pad and the first corner.

An exemplary embodiment of the present disclosure provides a light emitting diode including: a substrate; two or more, e.g., n (n being an integer of 2 or more), light emitting cells disposed parallel to each other on the substrate and having an elongated rectangular shape; a first electrode pad disposed on the first light emitting cell; a second electrode pad disposed on another, e.g., an $n^{th}$ light emitting cell; first, second and third extensions disposed on each of the light emitting cells; and a connector(s) connecting the light emitting cells to each other, wherein each of the light emitting cells includes a first conductive type semiconductor layer, a second conductive type semiconductor layer disposed on the first conductive type semiconductor layer, and an active layer interposed between the first conductive type semiconductor layer and the second conductive type semiconductor layer, and includes an opening formed through the second conductive type semiconductor layer and the active layer to expose the first conductive type semiconductor layer, wherein the first extension formed on each of the light emitting cells includes an extension elongated in a longitudinal direction of the light emitting cell, and is connected to the first conductive type semiconductor layer in the opening of the light emitting cell, the second extension and the third extension formed on each of the light emitting cells are electrically connected to the second conductive type semiconductor layer of the corresponding light emitting cell and extend from the second electrode pad or the connector to both sides of the first extension so as to surround the first extension, and the connector connects the first extension of a light emitting cell to the second and third extensions of an adjacent light emitting cell, the connector(s) being disposed near a corner(s) facing the first electrode pad, the second electrode pad or other connector in a diagonal direction.

ADVANTAGEOUS EFFECTS

According to exemplary embodiments of the present disclosure, first and second electrode pads are disposed on a substrate to face each other in a diagonal direction of the substrate in order to reduce a non-luminous area at each corner of the substrate, thereby improving luminous efficacy of the light emitting diode. Further, the first electrode pad is separated from side surfaces of a light emitting structure, thereby preventing current crowding near the side surfaces or corners of the light emitting structure.

In addition, with such arrangement of the first and second electrode pads, two or more light emitting diodes can be easily mounted on a substrate in a light emitting diode package through wire bonding while minimizing the area of bonding wires shielding a luminous region, thereby maximizing luminous efficacy of the light emitting diode package.

Furthermore, a first extension, a second extension and a third extension are arranged such that current can be uniformly spread over a wide area of the light emitting structure. Furthermore, the first extension is disposed between the second extension and the third extension so as to minimize a region for formation of the first extension, thereby minimizing loss of a luminous area.

Furthermore, a light emitting diode including a plurality of light emitting cells connected to each other in series can achieve uniform current distribution to each of the light emitting cells, thereby improving luminous efficacy.

DETAILED DESCRIPTION

Figure 1:
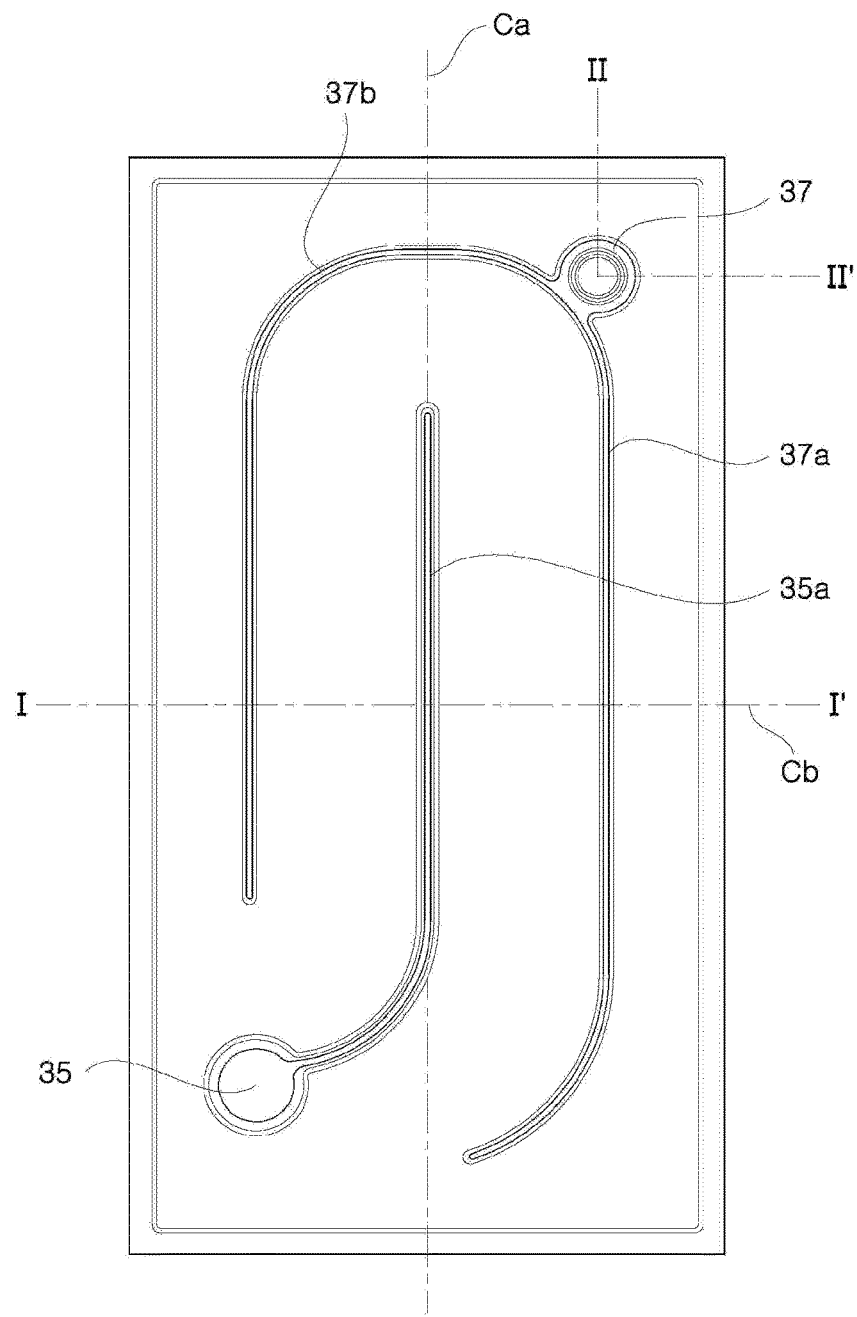
FIG. 1 is a plan view of a light emitting diode according to a first exemplary embodiment of the present disclosure.

Hereinafter, exemplary embodiments of the present disclosure will be described in detail with reference to the accompanying drawings. The following embodiments are provided by way of example to facilitate understanding of various embodiments of the present disclosure. Accordingly, the present disclosure is not limited to the embodiments disclosed herein and can also be implemented in different forms. When an element is referred to as being "disposed above" or "disposed on" another element, it can be directly "disposed above" or "disposed on" the other element, or intervening elements can be present. Throughout the specification, like reference numerals denote like elements having the same or similar functions.

In accordance with one exemplary embodiment, a light emitting diode includes: a substrate having a rectangular shape elongated in one direction; a light emitting structure including a first conductive type semiconductor layer disposed on the substrate, a second conductive type semiconductor layer disposed on the first conductive type semiconductor layer, and an active layer interposed between the first conductive type semiconductor layer and the second conductive type semiconductor layer, the light emitting structure having an opening formed through the second conductive type semiconductor layer and the active layer to expose the first conductive type semiconductor layer; a first electrode pad disposed on the first conductive type semiconductor layer in the opening to be closer to a first corner of the substrate than other corners thereof; a second electrode pad disposed on the second conductive type semiconductor layer to be relatively close to a second corner of the substrate facing the first corner; a first extension extending from the first electrode pad; and a second extension and a third extension extending from the second electrode pad to both sides of the first extension. The opening may be surrounded by the second conductive type semiconductor layer and the active layer and an imaginary line connecting a distal end of the second extension to a distal end of the third extension may be placed between the first electrode pad and the first corner.

The first electrode pad may be separated from both side edges of the light emitting structure to prevent or relieve current crowding near corners or side surfaces of the light emitting structure. Furthermore, the first electrode pad may be disposed in a region between the second extension and the third extension, thereby further relieving current crowding at the corners of the light emitting structure.

In some exemplary embodiments, a distance from the center of the first electrode pad to the imaginary line may be greater than a radius of the first electrode pad and smaller than a diameter thereof. The location of the first electrode pad is restricted to this range, thereby suppressing reduction of a luminous region near the first corner.

The center of the first electrode pad may be spaced apart from a longitudinal central axis of the light emitting structure and a distance from the center of the first electrode pad to the longitudinal central axis may be smaller than the diameter of the first electrode pad and greater than or equal to the radius thereof.

The first extension may include a curved section and a linear section. The curved section connects the first electrode pad to the linear section and the linear section extends in a longitudinal direction of the substrate. Particularly, the linear section of the first extension may be placed on the longitudinal central axis of the light emitting structure. Further, the curved section of the first extension may gradually approach a transversal central axis of the light emitting structure with increasing distance from the first electrode pad.

The linear section of the first extension may extend towards an upper edge of the light emitting structure and a distance from a distal end of the linear section of the first extension to the upper edge of the light emitting structure may be smaller than or equal to a distance from the linear section of the first extension to opposite side edges of the light emitting structure. Since the distal end of first extension is placed at the farthest location from the first electrode pad, the structure wherein the distal end of the first extension is placed apart from the upper edge of the light emitting structure can cause less current to flow near the upper edge of the light emitting structure. To prevent this problem, advantageously, the distance from the distal end of the linear section of the first extension to the upper edge of the light emitting structure is smaller than the distance from the linear section of the first extension to the opposite side edges of the light emitting structure.

Further, the shortest distance from the linear section of the first extension to the second extension may be the same as the shortest distance from the linear section of the first extension to the third extension.

In some exemplary embodiments, the second extension may include a first curved section, a linear section and a second curved section sequentially formed from the second electrode pad. The first curved section of the second extension may have a predetermined curvature and may extend from the second electrode pad so as to be gradually spaced apart from the longitudinal central axis of the light emitting structure; the linear section of the second extension may be parallel to the linear section of the first extension; and the second curved section of the third extension may intersect the longitudinal central axis of the light emitting structure.

Furthermore, the third extension may include a first curved section, a first linear section, a second curved section, a second linear section and a third curved section sequentially formed from the second electrode pad. The first curved section may extend from the second electrode pad so as to be spaced apart from the transversal central axis of the light emitting structure; the first linear section may be parallel to the transversal central axis of the light emitting structure and intersect the longitudinal central axis of the light emitting structure; the second curved section may have the same curvature as the first curved section and extend from the first linear section so as to approach the transversal central axis; the second linear section may be parallel to the linear section of the first extension; and the third curved section may be curved so as to be spaced apart from the transversal central axis and the longitudinal central axis of the light emitting structure.

The second electrode pad may be disposed to circumscribe the first curved section of the second extension and the first curved section of the third extension. This structure allows easy control of distances between the first extension, the second extension and the third extension.

The first curved section of the second extension and the first curved section of the third extension may be continuous with the same curvature. Furthermore, the second curved section of the second extension and the first curved section of the third extension may be symmetrical to the second curved section of the third extension with respect to the longitudinal central axis of the light emitting structure.

The first extension may include a curved section extending from the first electrode pad and a linear section extending from the curved section, and the shortest distance from the linear section of the first extension to the linear section of the second extension may be the same as the shortest distance from the linear section of the first extension to the second linear section of the third extension.

A distance from the linear section of the second extension to one side edge of the light emitting structure may be greater than half (½) and smaller than three quarters (¾) of the shortest distance from the linear section of the first extension to the linear section of the second extension.

Within these ranges of the distances from the linear sections of the second extension and the third extension to the edge of the light emitting structure, the light emitting diode can prevent current crowding on the side surface of the light emitting structure while securing uniform current spreading over a wide area of the light emitting structure.

A distance from the second linear section of the third extension to the upper edge of the light emitting structure may be smaller than the distance from the linear section of the second extension to the one side edge of the light emitting structure. Since the upper edge of the light emitting structure is far apart from the first electrode pad, the third extension is disposed closer to the upper edge of the light emitting structure than the one side edge thereof in order to attempt current spreading near the upper edge of the light emitting structure.

In one exemplary embodiment, the distance from the second linear section of the third extension to the upper edge of the light emitting structure may be greater than a distance from the second curved section of the second extension to a lower edge of the light emitting structure.

In some exemplary embodiments, the light emitting diode may further include a transparent electrode layer covering the light emitting structure. The second electrode pad, the second extension and the third extension may be disposed on the transparent electrode layer.

The light emitting diode may further include a current blocking layer disposed between the transparent electrode layer and the light emitting structure under the second electrode pad, the second extension and the third extension. The current blocking layer interrupts vertical flow of electric current from the second electrode pad, the second extension and the third extension to the light emitting structure through the transparent electrode layer, thereby further improving current spreading.

The current blocking layer disposed under the second electrode pad includes an opening exposing the light emitting structure and a portion of the second electrode pad may contact the second conductive type semiconductor layer. This structure can improve bonding strength of the second electrode pad while increasing a contact area between the second electrode pad and the transparent electrode layer.

In accordance with another exemplary embodiment of the present disclosure, a light emitting diode includes: a substrate; n (n being an integer of 2 or more) light emitting cells disposed parallel to each other on the substrate and having an elongated rectangular shape; a first electrode pad disposed on the first light emitting cell; a second electrode pad disposed on an $n^{th}$ light emitting cell; first, second and third extensions disposed on each of the light emitting cells; and a connector(s) connecting the light emitting cells to each other, wherein each of the light emitting cells includes a first conductive type semiconductor layer, a second conductive type semiconductor layer disposed on the first conductive type semiconductor layer, and an active layer interposed between the first conductive type semiconductor layer and the second conductive type semiconductor layer, and has an opening formed through the second conductive type semiconductor layer and the active layer to expose the first conductive type semiconductor layer, and wherein the first extension formed on each of the light emitting cells includes an extension elongated in a longitudinal direction of the light emitting cell and is connected to the first conductive type semiconductor layer in the opening of the light emitting cell, the second extension and the third extension formed on each of the light emitting cells are electrically connected to the second conductive type semiconductor layer of the corresponding light emitting cell and extend from the second electrode pad or the connector to both sides of the first extension so as to surround the first extension, and the connector connects the first extension of a light emitting cell to the second and third extensions of an adjacent light emitting cell, the connector(s) being disposed near a corner(s) facing the first electrode pad, the second electrode pad or other connector in a diagonal direction. Thus, the second extension and the third extension are formed to have substantially the same length, and the first, second and third extensions on each of the light emitting cells are arranged in a similar shape.

Each of the first extensions may include a curved section and a linear section. Each of the curved sections may connect the first electrode pad or the connector to the linear section and the linear section may extend in the longitudinal direction of the light emitting cell. Furthermore, the linear sections of the first extensions may be placed on longitudinal central axes of the light emitting cells, respectively, and the curved sections of the first extensions may gradually approach a transversal central axis of the light emitting structure with increasing distance from the first electrode pad or the connector.

Further, the shortest distance from the linear section of the first extension to the second extension may be the same as the shortest distance from the linear section of the first extension to the third extension. Furthermore, a distance from a distal end of the first extension to a point of the third extension placed on the longitudinal central axis of each of the light emitting cells is the same as the shortest distance from the linear section of the first extension to the second extension or the third extension, and a distance from the distal end of the first extension to the curved section of the third extension may be greater than the shortest distance.

Furthermore, the point of the third extension placed on the longitudinal central axis may be placed on the linear section.

The connectors may include a linear section inclined with respect to a minor axis direction of the light emitting cells. With this structure, the connectors may be disposed closer to corners of the light emitting cell.

The light emitting diode may further include a transparent electrode layer covering each of the light emitting cells, and the second electrode pad, the second extensions and the third extensions may be disposed on the transparent electrode layer.

The light emitting diode may further include a current blocking layer disposed between the transparent electrode layer and the light emitting cells under the second electrode pad, the second extension and the third extension.

The transparent electrode layer disposed under the second electrode pad may include an opening and a portion of the second electrode pad may contact the second conductive type semiconductor layer or the current blocking layer through the opening.

Hereinafter, exemplary embodiments of the present disclosure will be described in more detail with reference to the accompanying drawings.

Figure 2:
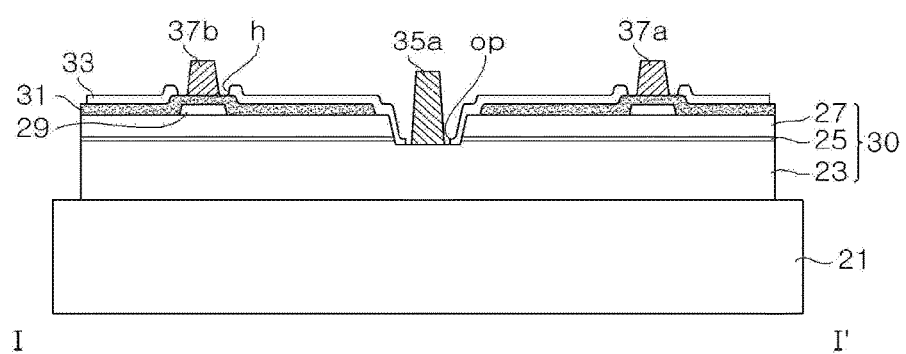
FIG. 2 is a cross-sectional view taken along line I-I' of FIG. 1.

FIG. 1 is a plan view of a light emitting diode according to a first exemplary embodiment of the present disclosure and FIG. 2 is a cross-sectional view taken along line I-I' of FIG. 1. FIG. 3 (a) is an enlarged view of a second electrode pad of the light emitting diode according to the first exemplary embodiment of the present disclosure, and FIG. 3 (b) is a cross-sectional view of the second electrode pad taken along line II-II' of FIG. 1.

Referring to FIG. 1 to FIG. 3, the light emitting diode according to the first exemplary embodiment includes a substrate 21, a light emitting structure 30, a first electrode pad 35, a second electrode pad 37, a first extension 35a, a second extension 37a, and a third extension 37b. The first extension 35a extends from the first electrode pad 35, and the second extension 37a and the third extension 37b extend from the second electrode pad 37.

The substrate 21 is not limited to a particular substrate and may be a sapphire substrate. Particularly, the substrate 21 may be a patterned sapphire substrate. In one exemplary embodiment, the substrate 21 may have a rectangular shape, without being limited thereto.

The light emitting structure 30 is disposed on the substrate 21, and includes a first conductive type semiconductor layer 23, an active layer 25 and a second conductive type semiconductor layer 27. The first conductive type semiconductor layer 23 may be or include an n-type semiconductor layer and the second conductive type semiconductor layer 27 may be or include a p-type semiconductor layer, or vice versa. The active layer 25 is interposed between the first conductive type semiconductor layer 23 and the second conductive type semiconductor layer 27.

The first conductive type semiconductor layer 23, the active layer 25 and the second conductive type semiconductor layer 27 may be formed of or include GaN-based compound semiconductor materials, that is, (Al, In, Ga)N. Compositional elements of the active layer 25 and a composition ratio thereof may be determined so as to emit light in a desired wavelength band, and the first conductive type semiconductor layer 23 and the second conductive type semiconductor layer 27 may be formed of or include materials having a larger energy band-gap than the active layer 25.

Each of the first conductive type semiconductor layer 23 and the second conductive type semiconductor layer 27 may be formed of or include a single layer or multiple layers. Further, the active layer 25 may have a single quantum-well structure or a multi-quantum well structure. Further, although not shown in the drawings, a buffer layer may be interposed between the substrate 21 and the first conductive type semiconductor layer 23.

The light emitting structure 30 may be formed by a metal organic chemical vapor deposition (MOCVD) or a molecular beam evaporation (MBE), and some region of the first conductive type semiconductor layer 23 may be exposed through photolithography and etching. As shown in FIG. 2, an opening op may be formed through the second conductive type semiconductor layer 27 and the active layer 25 so as to expose the first conductive type semiconductor layer 23. Here, the opening op exposing the first conductive type semiconductor layer 23 is linearly formed along the first extension 35a. The opening op defines a region in which the first electrode pad 35 and the first extension 35a will be formed. The opening op may be formed between two adjacent light emitting stacks including the second conductive type semiconductor layer 27 and the active layer 25 that are formed over the first conductive type semiconductor layer 23. In some implementations, the opening op is surrounded by the second conductive type semiconductor layer 27 and the active layer 25.

In some implementations, a transparent electrode layer 31 may be disposed on the second conductive type semiconductor layer 27. The transparent electrode layer 31 may be formed of or include a single layer or multiple layers formed of or including a transparent oxide such as indium tin oxide (ITO) or a metal oxide such as ZnO and $Al_2O_3$. The transparent electrode layer 31 forms ohmic contact with the second conductive type semiconductor layer 27. Accordingly, the transparent electrode layer 31 electrically contacts the second conductive type semiconductor layer 27 and serves to spread electric current over a wide region of the light emitting diode.

Further, as shown in FIG. 2, each of the second extension 37a and the third extension 37b may be disposed on the transparent electrode layer 31 and extends from the second electrode pad 37. Each of the second electrode pad 37, the second extension 37a and the third extension 37b is electrically connected to the transparent electrode layer 31.

The first extension 35a contacts and is electrically connected to the first conductive type semiconductor layer 23 exposed through the opening op.

An insulation layer 33 covers the transparent electrode layer 31. In some regions of the insulation layer 33 in which the second extension 37a and the third extension 37b are connected to the transparent electrode layer 31, holes (h) are formed to expose the transparent electrode layer 31. Further, the insulation layer 33 may cover the transparent electrode layer 31, the second conductive type semiconductor layer 27 and the active layer 25 on a side surface of the opening op through which the first conductive type semiconductor layer 23 is exposed. With this structure, when the first extension 35a is formed on the first conductive type semiconductor layer 23 exposed through opening op, the first extension 35a is prevented from being electrically connected to the transparent electrode layer 31, the second conductive type semiconductor layer 27 and the active layer 25.

Current blocking layers 29 may be interposed between the transparent electrode layer 31 and the second conductive type semiconductor layer 27. As shown in FIG. 2, the current blocking layers 29 may be disposed under the second extension 37a and the third extension 37b, and may also be disposed under the second electrode pad 37. In some implementations, the current the location of blocking layer 29 may be limited to under the second extension 37a and the third extension 37b and under the second electrode pad 37. Further, the current blocking layers 29 may be formed of or include an insulation material and prevent electric current from vertically flowing from the second extension 37a and the third extension 37b to the second conductive type semiconductor layer 27 through the transparent electrode layer 31. As a result, current crowding can be relieved near the second extension 37a and the third extension 37b, thereby improving current spreading performance.

Figure 3A:
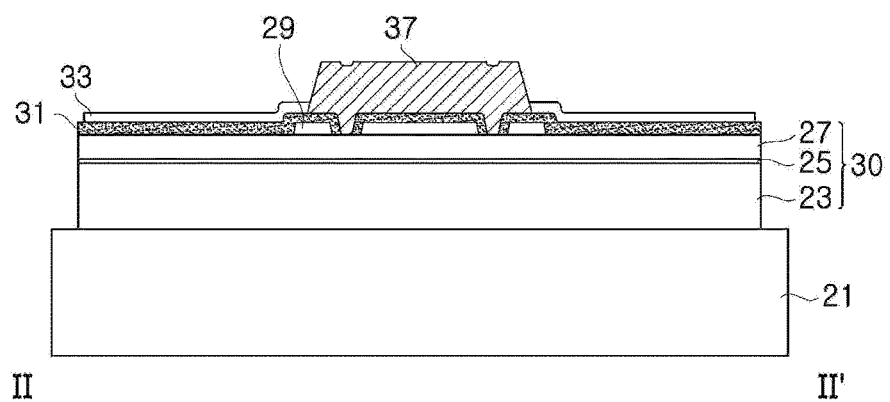
FIG. 3A and FIG. 3B show a cross-sectional view of a second electrode pad taken along line II-II' of FIG. 1 and an enlarged plan view of the second electrode pad of the light emitting diode according to the first exemplary embodiment.
Figure 3B:
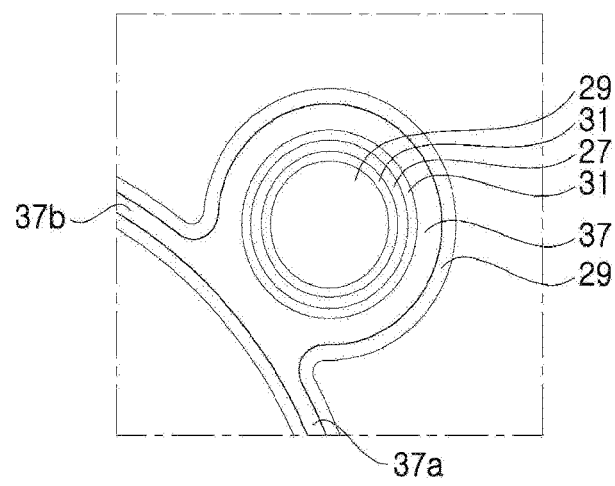

As shown in FIGS. 3A and 3B, the second electrode pad 37 may be formed on the transparent electrode layer 31 and may partially contact the second conductive type semiconductor layer 27. Further, the plural current blocking layers 29 may be separated from one another under the second electrode pad 37 and the transparent electrode layer 31. For example, as shown in FIG. 3B, the current blocking layers 29 may include an outer current blocking layer formed in a ring shape and placed in an outer region and a central current blocking layer placed in an inner region surrounded by the outer current blocking ring. In the structure wherein the plural current blocking layers 29 are separated from one another, a space between the current blocking layers 29 may be open and filled with the second electrode pad 37. With this structure, the second electrode pad 37 may contact the second conductive type semiconductor layer 27. On the other hand, the central current blocking layer may have a greater width than the width between an inner side of the ring-shaped outer current blocking layer and an outer side thereof. With the structure wherein the central current blocking layer is formed in a relatively wide area, it is possible to relieve current crowding under the second electrode pad 37.

Further, in the first exemplary embodiment, the transparent electrode layer 31 may be formed on the plural current blocking layers 29 so as to cover each of the current blocking layers 29. Thus, a contact area between the transparent electrode layer 31 and the first conductive type semiconductor layer 27 exposed between the current blocking layers 29 can be reduced, thereby preventing current crowding. Further, a contact area between the second electrode pad 37 and the transparent electrode layer 31 covering the plural current blocking layers 29 can be increased. On the other hand, as shown in FIG. 3(b), the second extension 37a and the third extension 37b may extend in a connected shape from the second electrode pad 37. That is, the second extension 37a may curvedly extend at the same curvature to be connected to the third extension 37b. On the other hand, the second electrode pad 37 is disposed outside an imaginary line connecting the second extension 37a to the third extension 37b. In other words, the imaginary line connecting the second extension 37a to the third extension 37b circumscribes the second electrode pad 37.

Referring back to FIG. 1, in the first exemplary embodiment, the first electrode pad 35 is disposed on the first conductive type semiconductor layer 23 in the opening op of the light emitting structure 30. Further, the first electrode pad 35 is separated from an edge or corner of the substrate 21. Furthermore, the center of the first electrode pad 35 is separated from a longitudinal central axis Ca or a transversal central axis Cb of the substrate 21. For example, in FIG. 1, the first electrode pad 35 is placed at the left with reference to the longitudinal central axis Ca of the substrate 21 having a rectangular shape and at a lower side with reference to the transversal central axis Cb. As used herein, the "longitudinal direction" indicates a long direction of the substrate 21, and the "transversal direction" indicates an orthogonal direction with respect to the longitudinal direction of the substrate 21. Further, the longitudinal central axis Ca means an axis intersecting the center of the substrate (or the center of the light emitting structure) in the longitudinal direction and the transversal central axis Cb means an axis intersecting the center of the substrate (or the center of the light emitting structure) in the transversal direction. Although the center of the substrate is illustrated as being coincident with the center of the light emitting structure herein, the longitudinal central axis and the transversal central axis will be defined with reference to the light emitting structure rather than the substrate if the center of the substrate is not coincident with the center of the light emitting structure.

The first electrode pad 35 may be disposed relatively close or as close as possible to a lower left corner of the substrate 21. A distance from the center of the first electrode pad 35 to the longitudinal central axis Ca may be greater than the diameter of the first electrode pad 35 and may be about two times the diameter of the first electrode pad 35. As a result, electric current can be supplied to a portion near the corner of the substrate 21, thereby maximizing a luminous region of the light emitting structure. Here, the first electrode pad 35 is disposed apart from the corner or edge of the substrate 21, thereby relieving current crowing near the corner or edge of the substrate 21 along the side surface of the light emitting structure 30. A distance from the center of the first electrode pad 35 to the edge of the light emitting structure 30 may be greater than the diameter of the first electrode pad 35.

Further, in FIG. 1, the second electrode pad 37 is placed to the right of the longitudinal central axis Ca of the substrate 21 having a rectangular shape and at an upper side with reference to the transversal central axis Cb. Here, the second electrode pad 37 may be disposed relatively closer or as close as possible to an upper right corner of the substrate 21. However, as shown in FIG. 1, the second electrode pad 37 is disposed apart from the side surface or the corner of the light emitting structure 30 in order to prevent current crowding along the side surface of the light emitting structure 30. For example, the second electrode pad 37 may be separated from the side surface of the light emitting structure 30 by a distance corresponding to the diameter of the second electrode pad 37.

Figure 4:
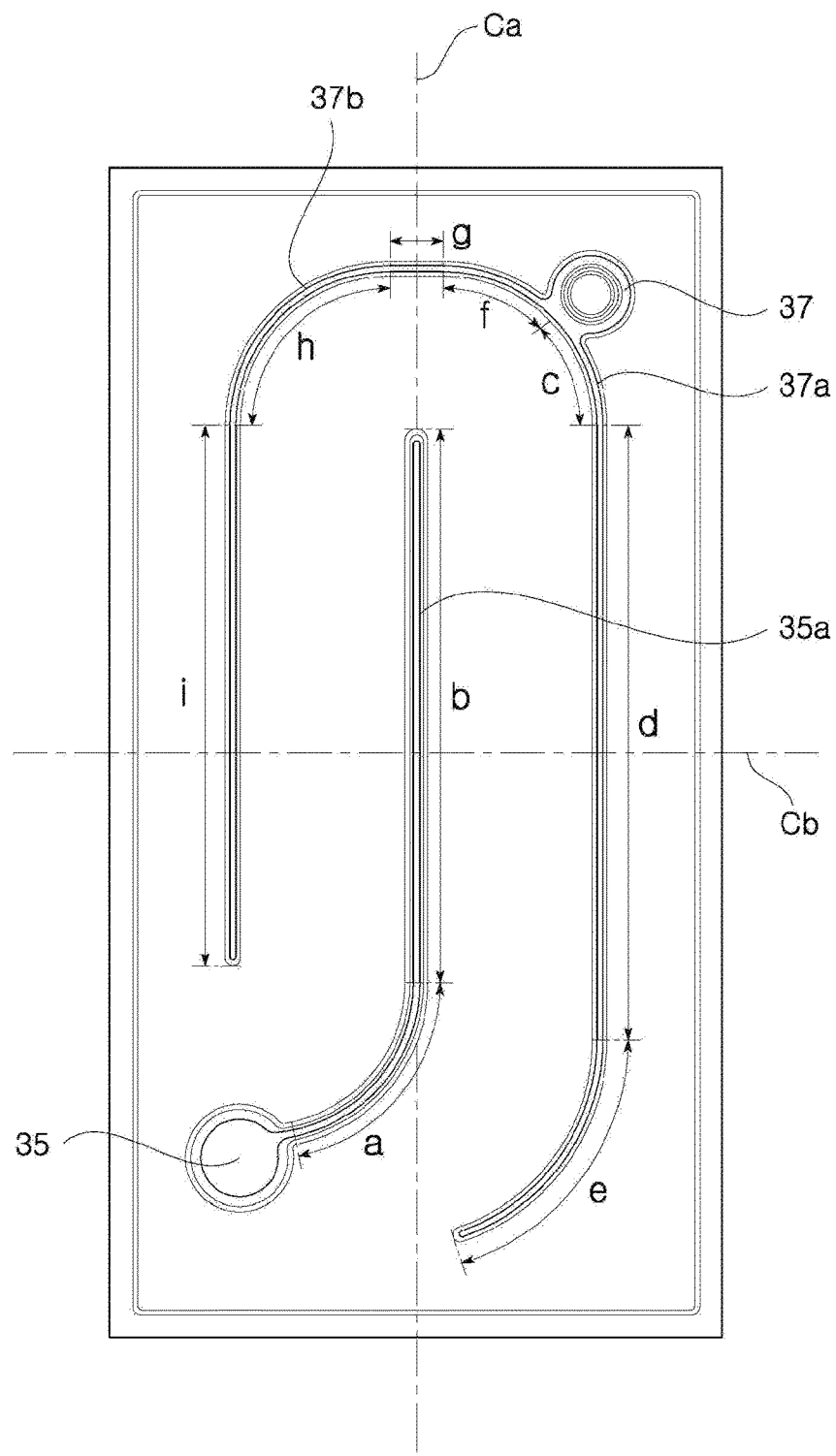
FIG. 4 is a plan view of the light emitting diode according to the first exemplary embodiment of the present disclosure, illustrating shapes of a luminous region and extensions.

The first electrode pad 35 and the second electrode pad 37 are disposed near opposite corners of the substrate 21, respectively, so as to allow efficient light emission at the corners of the substrate 21. FIG. 4 is a plan view illustrating the shapes of the luminous region and the extensions of the light emitting diode according to the first exemplary embodiment of the present disclosure.

The first extension 35a generally extends along the longitudinal central axis Ca of the substrate 21. Since the first electrode pad 35 is separated from the longitudinal central axis Ca, the first extension 35a includes a first section (a) extending from the first electrode pad 35 towards the longitudinal central axis Ca of the substrate 21 and a second section (b) extending from a distal end of the first section (a) along the longitudinal central axis Ca. Here, the first section (a) of the first extension 35a may extend in a curved shape having a predetermined curvature from the first electrode pad 35 towards the longitudinal central axis Ca and the second section (b) of the first extension 35a may extend in a linear shape. Thus, the first section (a) becomes a curved section and the second section (b) becomes a linear section. The first section (a) may extend towards the longitudinal central axis Ca so as to approach the transversal central axis Cb with increasing distance from the first electrode pad 35. On the other hand, the distal end of the first extension 35a extends towards an upper edge of the light emitting structure 30 along the longitudinal central axis Ca. A distance from the distal end of the first extension 35a to the upper edge of the light emitting structure 30 may be smaller than or equal to the distances from the second section (b) of the first extension 35a to opposite side edges of the light emitting structure 30. The structure wherein the distal end of the first extension 35a is disposed closer to the upper edge of the light emitting structure 30 than the side edges thereof can facilitate current spreading in a region far apart from the first electrode pad 35.

The second extension 37a extends from the second electrode pad 37 in the longitudinal direction of the substrate 21. The second extension 37a includes a first section (c) extending in a curved shape from the second electrode pad 37, a second section (d) linearly extending from the first section (c), and a third section (e) extending in a curved shape. Here, the second section (d), which is a linear section of the second extension 37a, may be parallel to the second section (b), which is the linear section of the first extension 35a. Further, the third section (e) may have a curved shape which has substantially the same curvature as the first section (a) of the first extension 35a. Thus, it is possible to adjust a distance between the first section (a) of the first extension and the third section (e) of the second extension 37a and a distance between the second section (b) of the first extension 35a and the second section (d) of the second extension 37a to a constant value. The first section (c) of the second extension 37a may be curved such that the distance from the distal end of the first extension 35a to each point of the first section (c) of the second extension 37a is constant. The distance from the distal end of the first extension 35a to each point of the first section (c) may be equal to or slightly longer than the shortest distance from the first extension 35a to the second section (d).

The third extension 37b extends from the second electrode pad 37 to intersect the longitudinal central axis Ca of the substrate 21 in the transversal direction and then extends in the longitudinal direction. For example, the third extension 37b may include a first section (f) extending in a curved shape from the second electrode pad 37, a second section (g) linearly extending parallel to the transversal central axis Cb, a third section (h) extending in a curved shape, and a fourth section (i) linearly extending parallel to the longitudinal central axis Ca.

The first section (f) of the third extension 37b may have the same curvature as the first section (c) of the second extension 37a and the second section (g) of the third extension 37b intersects the longitudinal central axis Ca. Further, the third section (h) may have the same curvature as the first section (f).

As such, the structure wherein the first to third extensions 35a, 37a, and 37b are formed in a linear shape and a curved shape allows the distances between the first extension 35a and the second and third extensions 37a, 37b to become a substantially constant value. That is, the distance between the second section (b) of the first extension 35a and the second section (d) of the second extension 37a is substantially the same as the distance between the second section (b) of the first extension 35a and the fourth section (i) of the third extension 37b. Further, the distance from a distal end of the second section (b) of the first extension 35a to the first section (c) of the second extension 37a is substantially the same as the distance from the distal end of the second section (b) of the first extension 35a to the first and third sections (f, h) of the third extension 37b. Further, the distance from a distal end of the fourth section (i) of the third extension 37b to the first section (a) of the first extension 35a is substantially constant and the distance from the first section (a) of the first extension 35a to the third section (e) of the second extension 37a is substantially constant. On the other hand, since the second section (g) of the third extension 37b has a linear shape, the distance from the distal end of the first extension 35a to the second section (g) varies. However, the shortest distance from the distal end of the first extension 35a to the second section (g) may be substantially the same as the distance from the first extension 35a to the second section (d) of the second extension 37a.

A distance from the second section (d) of the second extension 37a to the side edge of the light emitting structure 30 is substantially the same as the distance from the fourth section (i) of the third extension 37b to the other side edge of the light emitting structure 30. These distances may be greater than half (½) and smaller than three quarters (¾) of the shortest distance from the second section (b) of the first extension 35a to the second section (d) or the fourth section (i), and may be about ⅔ of the shortest distance from the second section (b) of the first extension 35a to the second section (d) or the fourth section (i). Here, the distance from the second section (d) of the second extension 37a to the side edge of the light emitting structure 30 and the distance from the fourth section (i) of the third extension 37b to the other side edge of the light emitting structure 30 are greater than the distance from the second section (g) of the third extension 37b to the upper edge of the light emitting structure 30.

Electric current supplied through the second electrode pad 37 may be uniformly distributed to the light emitting structure 30 through the first to third extensions 35a, 37a, and 37b and then flow to the first electrode pad 35.

Figure 5:
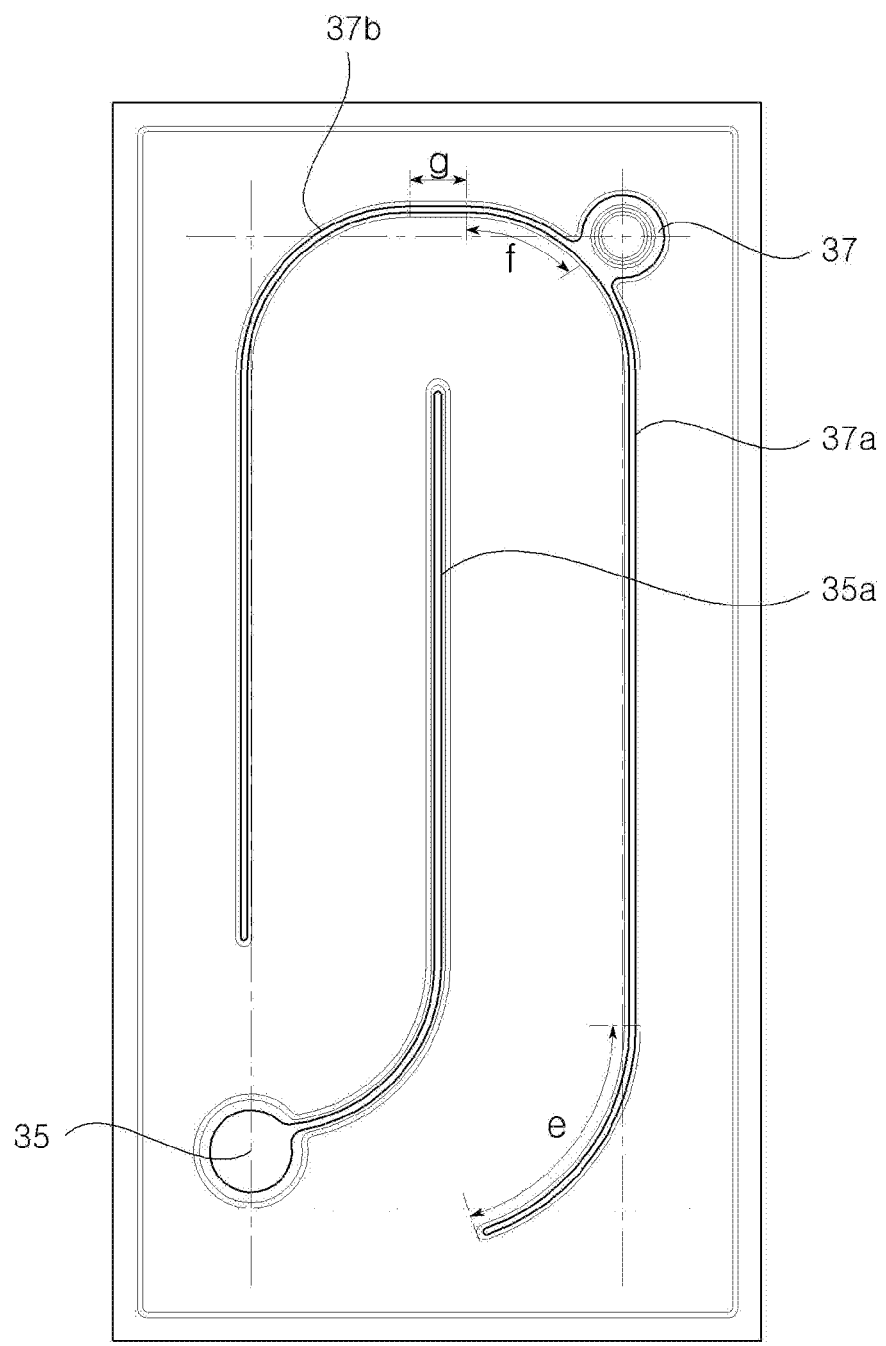
FIG. 5 is a plan view of the light emitting diode according to the first exemplary embodiment of the present disclosure, illustrating arrangement of electrode pads.

FIG. 5 is a plan view illustrating arrangement of the electrode pads 35 and 37 of the light emitting diode according to the first exemplary embodiment of the present disclosure.

Referring to FIG. 5, an imaginary line parallel to the longitudinal central axis Ca and the transversal central axis Cb of the substrate 21 with reference to the center of the second electrode pad 37, an imaginary line parallel to the longitudinal central axis Ca of the substrate 21 with reference to the center of the first electrode pad 35, and an imaginary line disposed at a lower side of the first electrode pad 35 and parallel to the transversal central axis Cb of the substrate 21 are shown.

In the first exemplary embodiment, even in the structure wherein the first electrode pad 35 is disposed near the lower left corner of the substrate 21, the first electrode pad 35 is closer to the transversal central axis Cb of the substrate 21 than the distal end of the third section (e) of the second extension 37a. Furthermore, the first electrode pad 35 is disposed such that an imaginary line passing through a certain point on the first electrode pad 35 and parallel to the transversal central axis Cb of the substrate 21 intersects the third section (e) of the second extension 37a. With this structure, a luminous region can be enlarged at a lower right side of the substrate 21 at which the first and second electrode pads 35 and 37 are not disposed.

Further, the second section (g) corresponding to the first linear section of the third extension 37b is disposed above an imaginary line passing through the center of the second electrode pad 37 and parallel to the transversal central axis Cb of the substrate 21. Accordingly, the second section (g) is disposed far apart from the transversal central axis Cb of the substrate 21. To this end, the first section (f) of the third extension 37b extending from the second electrode pad 37 has a curved shape and extends from the second electrode pad 37 to be gradually spaced apart from the transversal central axis Cb. With this structure, the light emitting diode can prevent electric current from flowing near the upper edge of the light emitting structure 30 formed on the substrate 21 while allowing light emission in an upper central region of the substrate 21.

Figure 6:
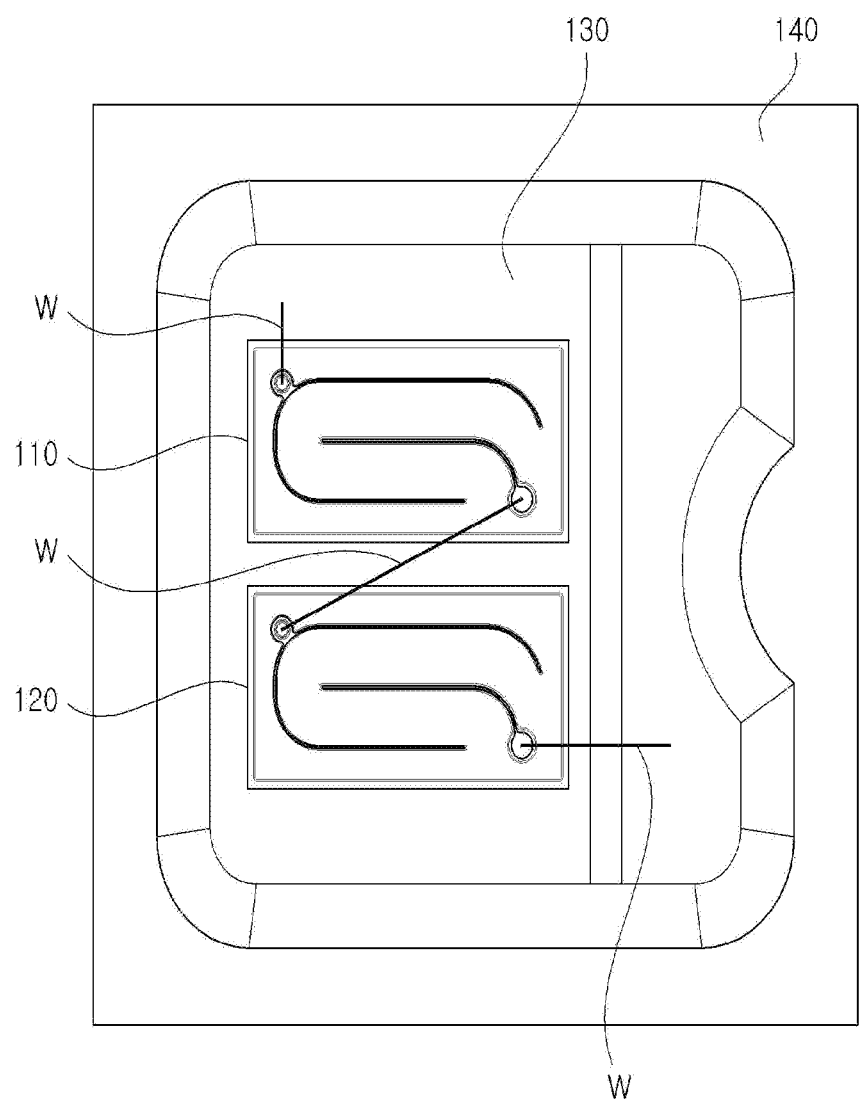
FIG. 6 is a plan view of a light emitting diode package using the light emitting diode according to the first exemplary embodiment of the present disclosure.

FIG. 6 is a plan view of a light emitting diode package including the light emitting diode according to the first exemplary embodiment of the present disclosure.

Referring to FIG. 6, the light emitting diode package includes light emitting diodes 110, 120, a lead frame 130, a package body 140, and wires W. With the lead frame 130 packaged in the package body, the plural light emitting diodes 110 and 120 are mounted on the lead frame 130. The lead frame 130 is electrically connected to the light emitting diodes 110 and 120 via the wires W.

As shown in FIG. 6, in order to connect two or more light emitting diodes 110 and 120 to each other in series through the wires W, the first electrode pad 35 of a first light emitting diode 110 is connected to the second electrode pad 37 of a second light emitting diode 120 via the wire, and the second electrode pad 37 of the first light emitting diode 110 and the first electrode pad 35 of the second light emitting diode 120 are electrically connected to the lead frame 130.

In the light emitting diode according to the first exemplary embodiment, since the first electrode pad 35 and the second electrode pad 37 are disposed near the corners of the light emitting diode instead of being disposed at the center thereof, a region of the wire W shielding the light emitting diodes 110 and 120 is minimized in the structure wherein the first electrode pad 35 of the first light emitting diode 110 is connected to the second electrode pad 37 of the second light emitting diode 120 via the wire W. Thus, in the light emitting diode package fabricated using the light emitting diodes according to the first exemplary embodiment, regions of the light emitting diodes 110 and 120 shielded by the wire W can be minimized, thereby maximizing luminous efficacy of the light emitting diode package.

Figure 7:
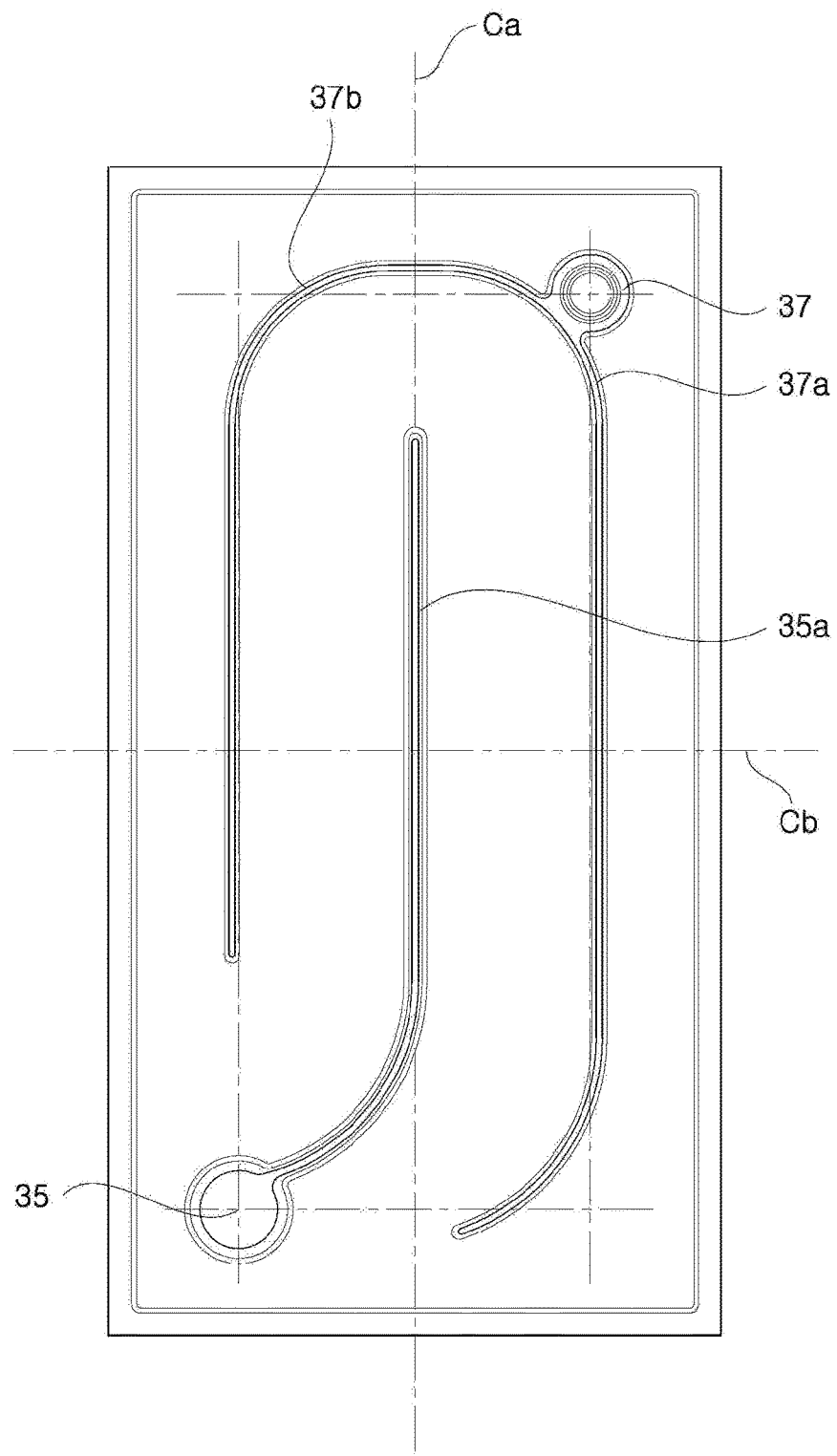
FIG. 7 is a plan view of a light emitting diode according to a second exemplary embodiment of the present disclosure.

FIG. 7 is a plan view of a light emitting diode according to a second exemplary embodiment of the present disclosure.

The light emitting diode according to the second exemplary embodiment includes a substrate 21, a light emitting structure 30, a first electrode pad 35, a second electrode pad 37, a first extension 35a, a second extension 37a, and a third extension 37b. The light emitting diode according to the second exemplary embodiment is generally similar to the light emitting diode according to the first exemplary embodiment and description of the same components will be omitted.

Referring to FIG. 7, the first electrode pad 35 is disposed near a lower left corner of the substrate 21. In the second exemplary embodiment, the first electrode pad 35 is disposed at a lower position than the first electrode pad 35 according to the first exemplary embodiment. Accordingly, the first electrode pad 35 is far apart from the transversal central axis Cb. An imaginary line passing through the center of the first electrode pad 35 and parallel to the transversal central axis Cb of the substrate 21 intersects the third section (e) of the second extension 37a. However, the lowermost end of the first electrode pad 35 is disposed farther from the transversal central axis Cb than the lowermost end of the third section (e) of the second extension 37a. Accordingly, an imaginary line extending from the lowermost end of the first electrode pad 35 to be parallel to the transversal central axis Cb of the substrate 21 does not intersect the third section of the second extension 37a.

With the structure wherein the first electrode pad 35 of the light emitting diode according to the second exemplary embodiment is disposed closer to the corner of the substrate 21, a luminous region at the corner of the substrate 21 on which the first electrode pad 35 is disposed can be increased. Furthermore, the first electrode pad 35 and the second electrode pad 37 are separated from each other by a constant distance, thereby allowing the light emitting diode to exhibit stable electrical characteristics.

Figure 8:
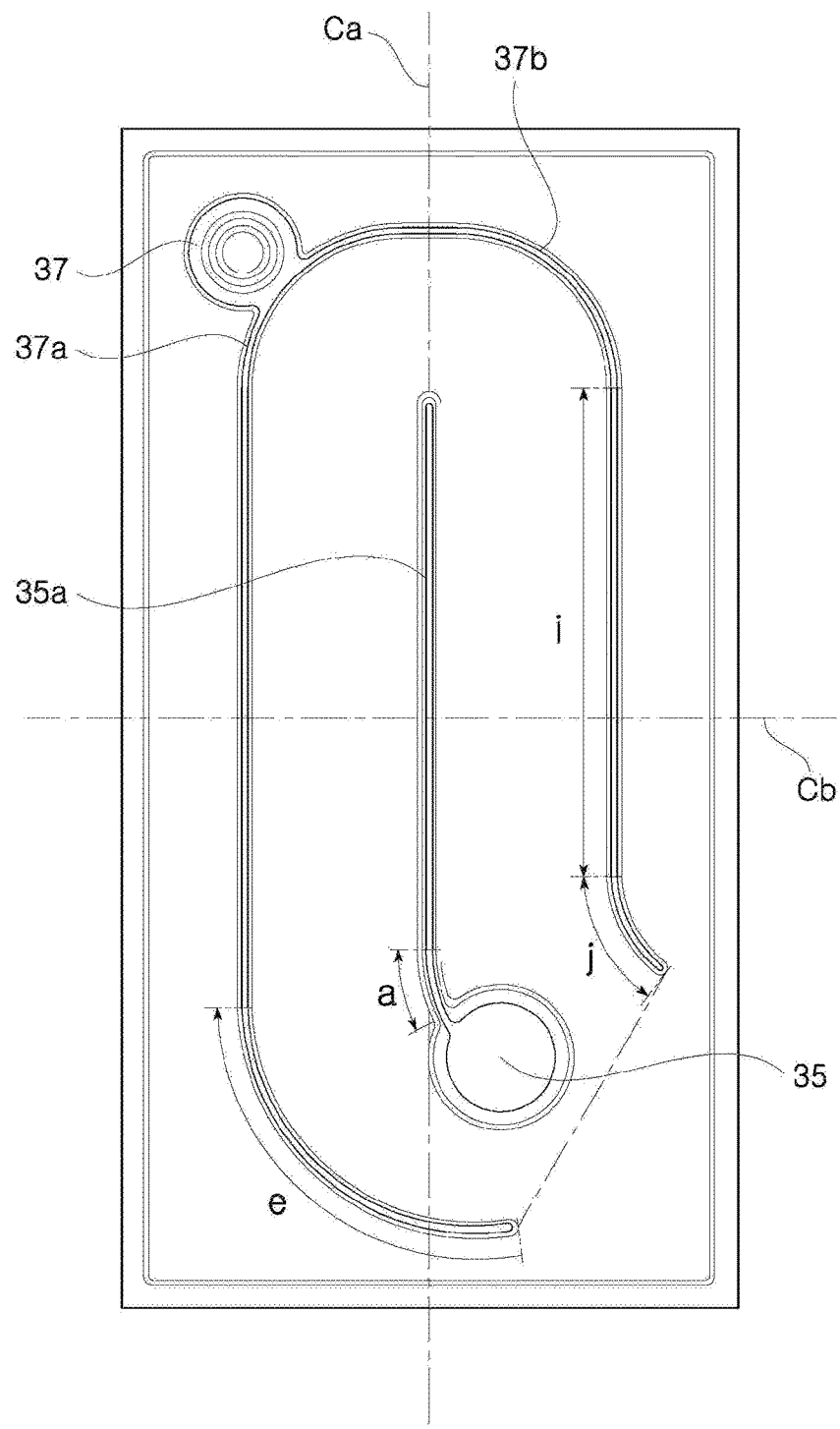
FIG. 8 is a plan view of a light emitting diode according to a third exemplary embodiment of the present disclosure.

FIG. 8 is a plan view of a light emitting diode according to a third exemplary embodiment of the present disclosure.

The light emitting diode according to the third exemplary embodiment includes a substrate 21, a light emitting structure 30, a first electrode pad 35, a second electrode pad 37, a first extension 35a, a second extension 37a, and a third extension 37b. In the following description of the third exemplary embodiment, descriptions of the same components as those of the first exemplary embodiment will be omitted.

Referring to FIG. 8, the locations of the first electrode pad 35 and the second electrode pad 37 according to this exemplary embodiment are different from those in the first and second exemplary embodiments. The first electrode pad 35 and the second electrode pad 37 of FIG. 8 are respectively disposed on the right and left sides of the longitudinal central axis Ca, while the first electrode pad 35 and second electrode pad 37 of FIG. 1 are respectively disposed on the left and right sides of the longitudinal central axis Ca. The right and left locations of the first and second electrode pads 35 and 37 of the light emitting diode may be changed or reversed in consideration of wiring upon packaging without causing any difference in operation of the light emitting diode.

In some embodiments, the first electrode pad 35 of the light emitting diode is disposed farther from the corner of the substrate 21 to be disposed closer to the longitudinal central axis Ca than the first electrode pad according to the first exemplary embodiment. Further, in this exemplary embodiment, the first electrode pad 35 and the second electrode pad 37 have greater sizes than those of the first exemplary embodiment. Thus, the first section (a) of the first extension 35a is shorter and the third section (e) of the second extension 37a is longer than those of the first exemplary embodiment, and the second extension 37b further includes a fifth curvature section (j) extending from the fourth section (i) thereof towards the left side edge of the light emitting structure 30.

In some embodiments, the first electrode pad 35 is disposed closer to the longitudinal central axis Ca and the transversal central axis Cb of the substrate 21 than the first electrode pad according to the first exemplary embodiment. For example, in the first exemplary embodiment, the distance from the center of the first electrode pad 35 to the longitudinal central axis Ca is greater than the diameter of the first electrode pad 35, whereas, in this exemplary embodiment, the distance from the center of the first electrode pad 35 to the longitudinal central axis Ca is smaller than the diameter of the first electrode pad 35. In this exemplary embodiment, the center of the first electrode pad 35 is apart from the longitudinal central axis Ca. The distance from the center of the first electrode pad 35 to the longitudinal central axis Cb of the first electrode pad 35 may be greater than or equal to the radius of the first electrode pad 35 and may be smaller than the diameter thereof. Further, the shortest distance from the center of the first electrode pad 35 to the edge of the light emitting structure 30 may be greater than the diameter of the first electrode pad 35.

The length of the first section (a) of the first extension 35a gradually decreases as the first electrode pad 35 approaches the longitudinal central axis Ca and the transversal central axis Cb. Further, the first section (a) may have a smaller curvature than the first section (a) of the first exemplary embodiment.

On the other hand, as the location of the first electrode pad 35 varies, the third section (e) of the second extension 37a is further elongated and the fifth curvature section (j) extending from the distal end of the third extension 37b is added in order to reinforce current spreading near the corner of the substrate adjacent to the first electrode pad 35. The third section (e) of the second extension 37a may be further elongated in a constant curvature, but is not limited thereto. Alternatively, the third section (e) may be further elongated in a large curvature. The third section (e) does not extend beyond the longitudinal central axis Ca.

In addition, the fifth section (j) may have the same curvature as the third section (e), but is not limited thereto. Alternatively, the fifth section (j) may have a smaller curvature than the third section (e). The fifth section (j) is curved towards the edge of the light emitting structure 30 so as to be disposed farther from the first electrode pad 35. The distance from the fifth section (j) to the light emitting structure 30 may be substantially the same as the shortest distance from the third section (e) to the light emitting structure 30.

On the other hand, the first electrode pad 35 is disposed closer to the longitudinal central axis Ca than an imaginary line connecting the distal end of the third section (e) of the second extension 37a and the distal end of the fifth section (j) of the third extension 37b. Thus, the imaginary line connecting the distal end of the second extension 37a and the distal end of the third extension 37b is placed between the first electrode pad 35 and the corner of the substrate 21. In addition, the imaginary line connecting the distal end of the third section (e) of the second extension 37a and the distal end of the fifth section (j) of the third extension 37b is separated from the first electrode pad 35. For example, a distance from the imaginary line connecting the third section (e) and the fifth section (j) to the center of the first electrode pad 35 may be greater than the radius of the first electrode pad 35 and smaller than the diameter thereof. Further, the distance from the distal end of the third section (e) to the center of the first electrode pad 35 is substantially the same as or shorter than the distance from the distal end of fifth section (j) to the center of the first electrode pad 35 by 10% or less.

On the other hand, the first to fourth sections (f), (g), (h), and (i), of the third extension 37b may be the same as those of the first exemplary embodiment, and detailed descriptions thereof will be omitted. In this exemplary embodiment, the fourth section (i) may be slightly shorter than the fourth section in the first exemplary embodiment. In addition, as the length of the third section (e) of the second extension 37a increases, the distance from the second section (g) of the third extension to the upper edge of the light emitting structure 30 may be greater than a distance from the third section (e) to a lower edge of the light emitting structure 30. On the other hand, the first section (f) and the third section (h) of the third extension 37b are formed in a curved shape such that the center of the curved shape is placed inside the substrate 21, for example, so as to become the distal end of the first extension 35*a*, and the fifth section (j) of the third extension 37*b* is formed in a curved shape such that the center of the curved shape is placed near the edge of the substrate 21.

On the other hand, as in the first exemplary embodiment, the second electrode pad 37 is disposed to circumscribe the second extension 37*a* and the third extension 37*b*. The second electrode pad 37 may have a larger size than the second electrode pad 37 of the first exemplary embodiment and thus the center of the second electrode pad 37 may be closer to the second corner of the substrate than the center of the second electrode pad of the first exemplary embodiment. Here, the second electrode pad 37 is separated from the edges of the light emitting structure by a distance smaller than the radius of the second electrode pad 37. Accordingly, the shortest distance from the center of the second electrode pad 37 to the edge of the light emitting structure 30 may be greater than the radius of the second electrode pad 37 and smaller than the diameter thereof.

Figure 9:
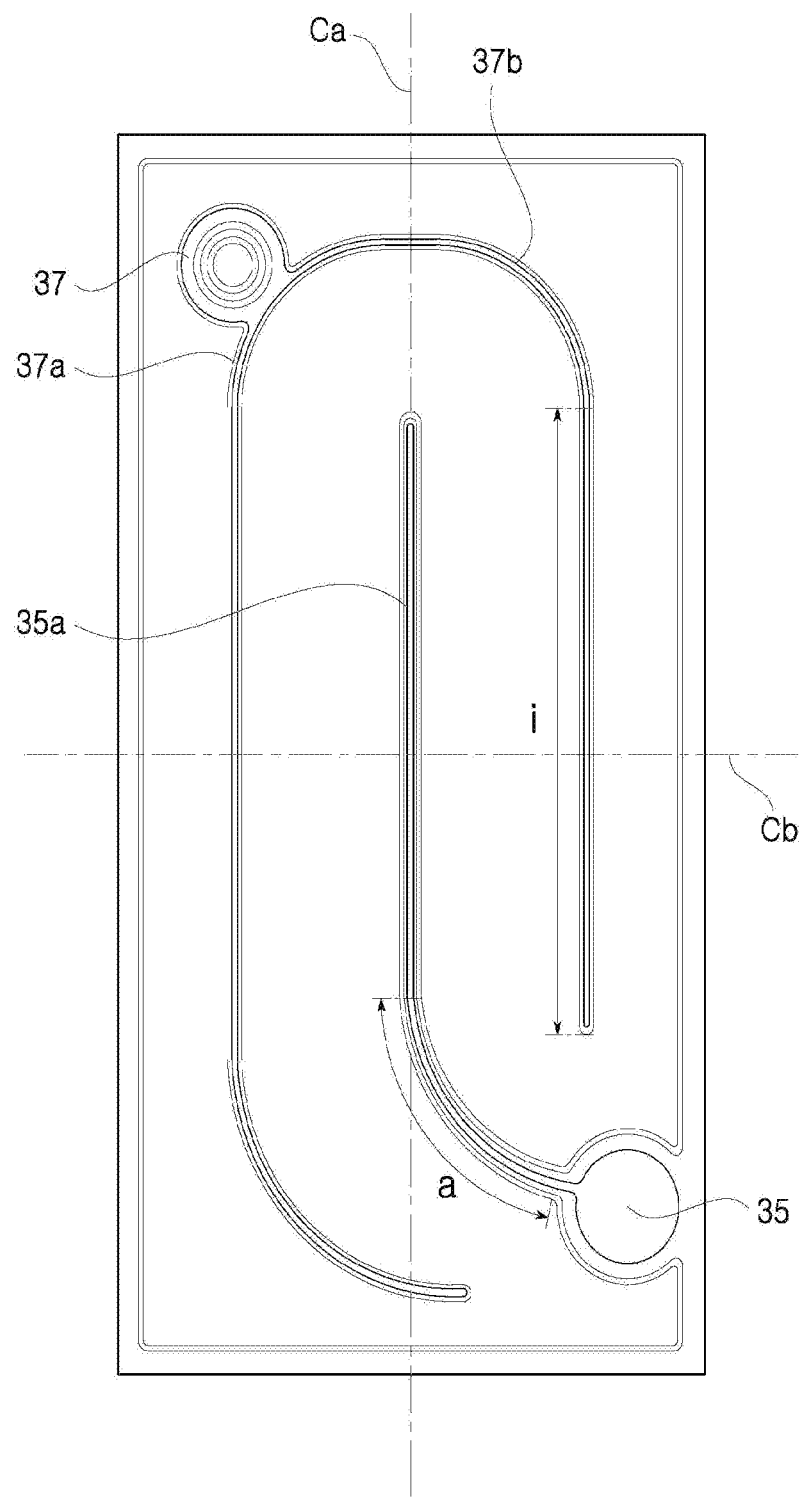
FIG. 9 is a plan view of a light emitting diode according to a fourth exemplary embodiment of the present disclosure.

FIG. 9 is a plan view of a light emitting diode according to a fourth exemplary embodiment of the present disclosure.

The light emitting diode according to the fourth exemplary embodiment includes a substrate 21, a light emitting structure 30, a first electrode pad 35, a second electrode pad 37, a first extension 35*a*, a second extension 37*a*, and a third extension 37*b*. In the following description of the fourth exemplary embodiment, descriptions of the same components as those of the first exemplary embodiment will be omitted.

Referring to FIG. 9, the locations of the first electrode pad 35 and the second electrode pad 37 according to this exemplary embodiment are different from those in the first and second exemplary embodiments as in the third exemplary embodiment.

In the fourth exemplary embodiment, the first electrode pad 35 is disposed near a right corner of the substrate 21. This structure can prevent formation of a non-luminous region near the right corner of the substrate 21. With the structure wherein the first electrode pad 35 is disposed at the lower right side of the substrate 21 so as to be adjacent to a right side surface of the substrate 21, the first electrode pad 35 is disposed outside a region between the second extension 37*a* and the third extension 37*b*.

In this way, as the first electrode pad 35 is disposed adjacent to the lower right side of the substrate 21, the fourth section (i) of the third extension 37*b* may be longer than that in the first exemplary embodiment in order to maintain a constant distance between the first electrode pad 35 and the third extension 37*b*. In addition, the first section (a) of the first extension 35*a* may be longer than that in the first exemplary embodiment.

Figure 10:
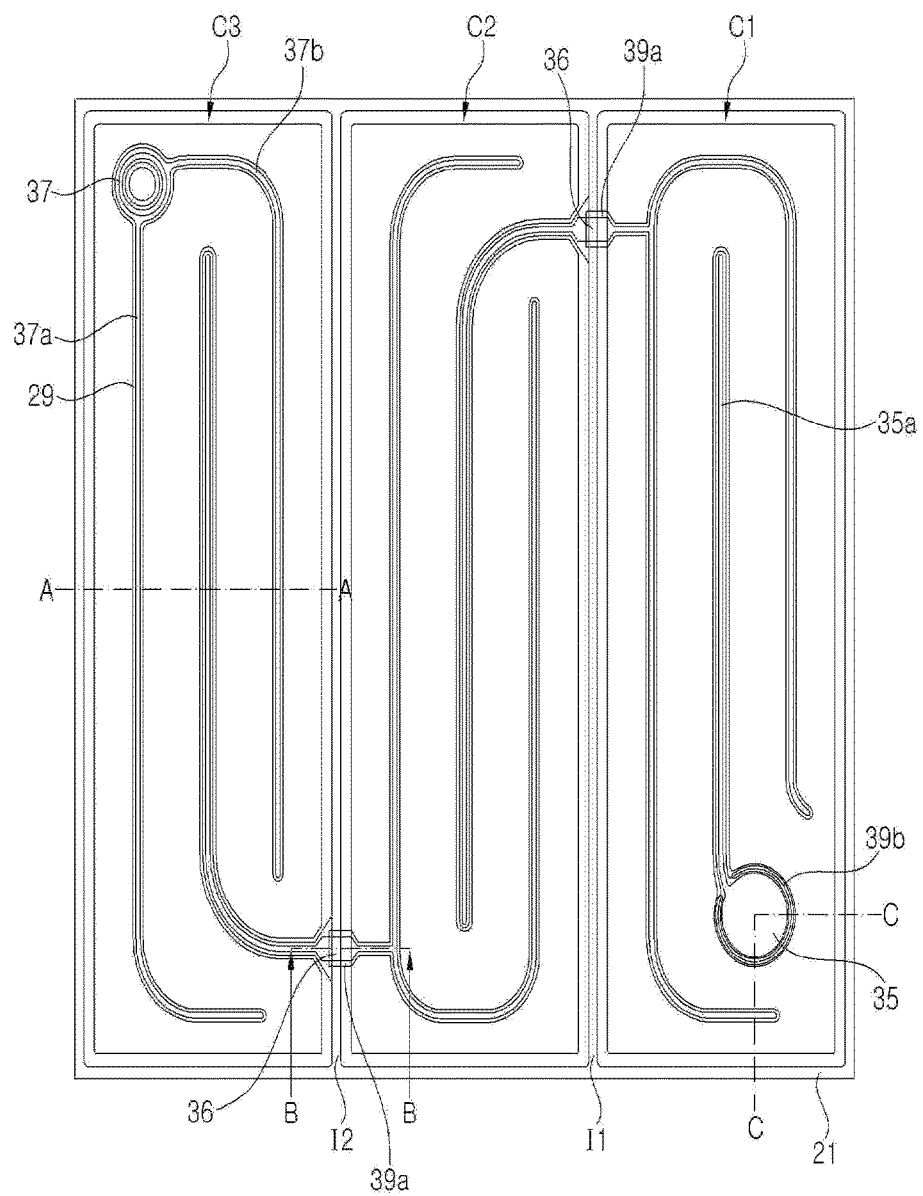
FIG. 10 is a plan view of a light emitting diode according to a fifth exemplary embodiment of the present disclosure.
Figure 11A:
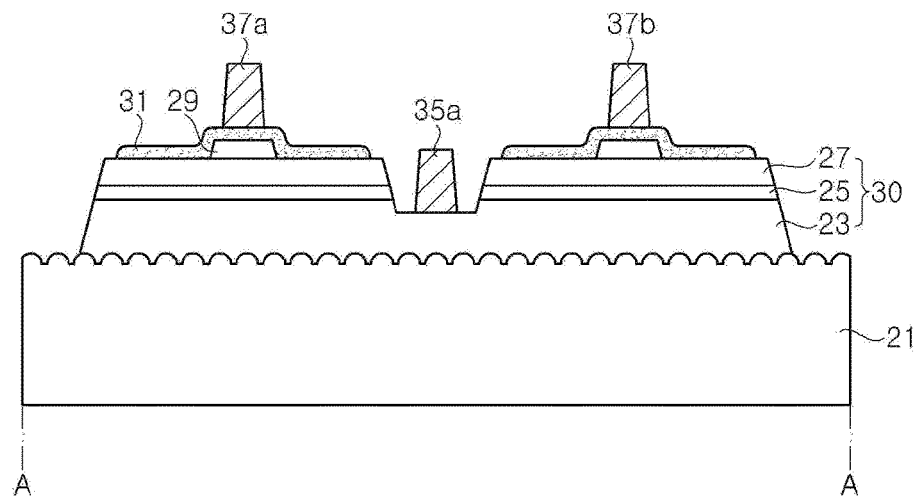
FIG. 11A, FIG. 11B and FIG. 11C are schematic cross-sectional views taken along lines A-A, B-B and C-C of FIG. 10, respectively.
Figure 11B:
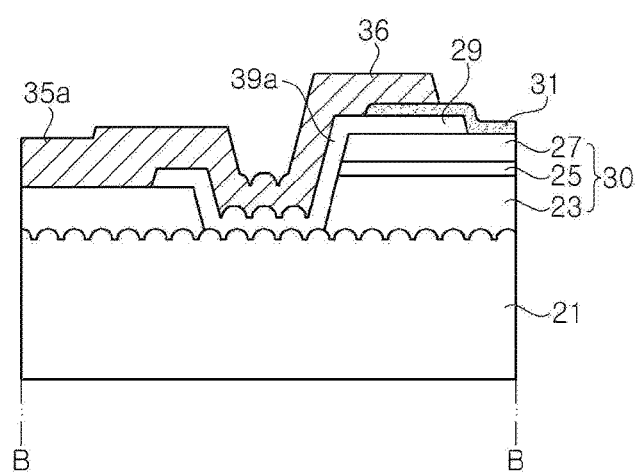
Figure 11C:
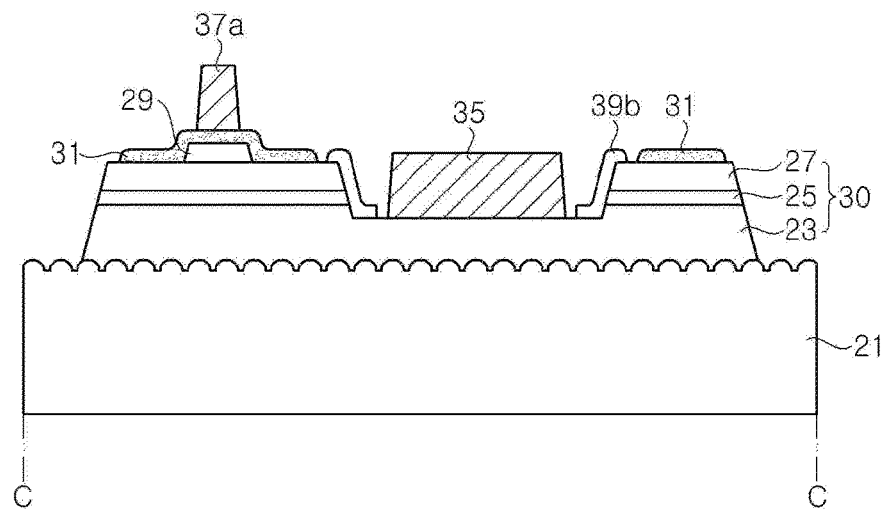
Figure 12:
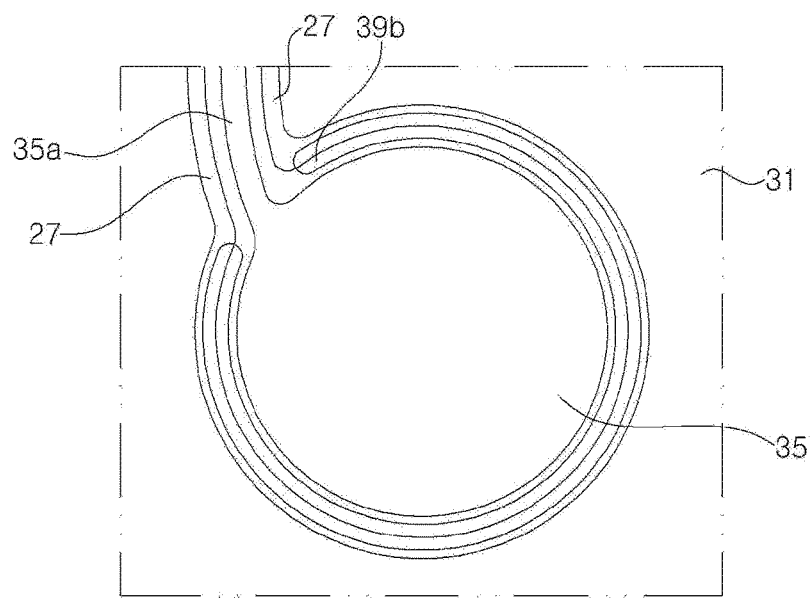
FIG. 12 is an enlarged plan view of a first electrode pad shown in FIG. 10.

FIG. 10 is a plan view of a light emitting diode according to a fifth exemplary embodiment of the present disclosure, FIG. 11A, FIG. 11B and FIG. 11C are schematic cross-sectional views taken along lines A-A, B-B and C-C of FIG. 10, respectively, and FIG. 12 is an enlarged plan view of a first electrode pad shown in FIG. 10.

Referring to FIG. 10, FIG. 11A, FIG. 11B, and FIG. 11C, the light emitting diode according to the fifth exemplary embodiment includes a substrate 21, a light emitting structure 30, a first electrode pad 35, a second electrode pad 37, first extensions 35*a*, second extensions 37*a*, and third extensions 37*b*. In this exemplary embodiment, the light emitting structure 30 is divided into a plurality of light emitting cells C1, C2, and C3 and first to third extensions 35*a*, 37*a*, and 37*b* are disposed on each of the light emitting cells.

The substrate 21 is not limited to a particular substrate and may be a sapphire substrate. Particularly, the substrate 21 may be a patterned sapphire substrate. In this exemplary embodiment, the substrate 21 may have a rectangular shape, without being limited thereto.

The light emitting structure 30 is disposed on the substrate 21, and includes a first conductive type semiconductor layer 23, an active layer 25 and a second conductive type semiconductor layer 27. The stack structure of the light emitting structure 30, the first conductive type semiconductor layer 23, the active layer 25 and the second conductive type semiconductor layer 27 are the same as those of the above exemplary embodiments, and detailed descriptions thereof will be omitted.

The light emitting structure 30 is divided into a plurality of (n) light emitting cells by cell isolation regions I1, I2. Although three light emitting cells C1, C2, C3 are shown in FIG. 10, it should be understood that other implementations are also possible. n may an integer of 2 or more, particularly, 3 or more. If n is odd, the electrode pads 35, 37 may be advantageously disposed in the diagonal direction of the substrate 21.

The light emitting cells C1, C2, C3 have an elongated rectangular shape and are parallel to one another. Thus, an even number light emitting cell is disposed between the odd number light emitting cells. For example, a second light emitting cell C2 is disposed between first and third light emitting cells C1, C3, as shown in FIG. 10.

A transparent electrode layer 31 is disposed on the second conductive type semiconductor layer 27. The transparent electrode layer 31 may be composed of or include a single layer or multiple layers formed of or including a transparent oxide such as indium tin oxide (ITO) or a metal oxide such as ZnO and $Al_2O_3$. The transparent electrode layer 31 forms ohmic contact with the second conductive type semiconductor layer 27. That is, the transparent electrode layer 31 electrically contacts the second conductive type semiconductor layer 27 and serves to spread electric current over a wide region of the light emitting diode.

Further, as shown in FIG. 11A, the second extension 37*a* and the third extension 37*b* on each of the light emitting cells C1, C2, and C3 may be disposed on the transparent electrode layer 31 so as to be arranged on both sides of the first extension 35*a*. In this exemplary embodiment, since the second electrode pad 37 is not disposed on all of the light emitting cells C1 to C3, it is not necessary that all of the second extensions 37*a* and the third extensions 37*b* extend from the second electrode pad 37. As shown in FIG. 10, the second extension 37*a* and the third extension 37*b* on the third light emitting cell C3 extend from the second electrode pad 37, whereas the second extension 37*a* and the third extension 37*b* on the first and second light emitting cells C1 and C2 are separated from the second electrode pad 37 and extend from connectors 36.

The second electrode pad 37, the second extensions 37*a* and the third extensions 37*b* are disposed on the transparent electrode layer 31 on each of the light emitting cells C1 to C3 so as to be electrically connected to the transparent electrode layer 31.

The first extension 35*a* contacts and is electrically connected to the first conductive type semiconductor layer 23 exposed by mesa etching. In the light emitting diode according to this exemplary embodiment, the insulation layer 33 of the first exemplary embodiment may be omitted.

As in the above exemplary embodiment, current blocking layers 29 may be interposed between the transparent electrode layer 31 and the second conductive type semiconductor layer 27. As shown in FIG. 11A, the current blocking layers 29 may be disposed under the second extension 37a and the third extension 37b, and may also be disposed under the second electrode pad 37. In some implementations, the location of the current blocking layer 29 may be limited to under the second extension 37a and the third extension 37b or under the second electrode pad 37. The current blocking layers 29 according to this exemplary embodiment are the same as the current blocking layers 29 according to the above exemplary embodiment and thus a detailed description thereof will be omitted.

On the other hand, the second electrode pad 37, the current blocking layers 29 related to the second electrode pad 37, and the transparent electrode layer 31 are similar to those described in FIGS. 3 (a) and (b), and thus detailed descriptions thereof will be omitted to avoid repetition.

Although the second extension 37a and the third extension 37b are illustrated as being connected to each other and extending from the second electrode pad 37 in FIG. 3(b), the second extension 37a and the third extension 37b on the third light emitting cell C3 may be connected to the second electrode pad 37 in this exemplary embodiment. That is, the second electrode pad 37 may be disposed between the second extension 37a and the third extension 37b. The second extension 37a and the third extension 37b disposed on the first and second light emitting cells C1 and C2 are connected to each other. With this structure, the second extension 37a may be directly connected to the second electrode pad 37 via a linear section of the second extension 37a without forming a curved section. In addition, the second extensions 37a extending from the connectors 36 may also be directly connected to the connectors 36 via linear sections of the second extension 37a. Alternatively, a curved section may be disposed between the linear section and the second electrode pad 37 as in the above exemplary embodiment.

Referring back to FIG. 10, in this exemplary embodiment, the first electrode pad 35 is disposed on the first conductive type semiconductor layer 23 in an opening of the light emitting structure 30, as described with reference to FIG. 1. The first electrode pad 35 is disposed on the first light emitting cell C1 and the second electrode pad 37 is disposed on the third ($n^{th}$) light emitting cell. Further, the first electrode pad 35 is apart from an edge or corner of the substrate 21. Furthermore, the center of the first electrode pad 35 is apart from a longitudinal central axis or a transversal central axis of the first light emitting cell C1. The size and location of the first electrode pad 35 according to this exemplary embodiment are similar to those of the first electrode pad 35 according to the above exemplary embodiments except that the following description will be given with reference to the first light emitting cell C1 having an elongated rectangular shape, and thus detailed descriptions thereof will be omitted. For example, the first electrode pad 35 according to this exemplary embodiment is disposed closer to the longitudinal central axis than an imaginary line connecting the distal ends of the second extension 37a and the third extension 37b on the first light emitting cell C1, as described with reference to FIG. 8.

The first electrode pad 35 faces the second electrode pad 37 in the diagonal direction so as to be placed near the corner of the substrate 21, thereby facilitating a wire bonding process. In one example shown in FIG. 10, the first electrode pad 35 and the second electrode pad 37 are formed on a plane including the light emitting cell C1, C2 and C3 and the first electrode pad 35 is formed near one corner, for example, the left upper corner of the plane and the second electrode pad 37 is formed near another corner of the plane, for example, the right lower corner of the plane.

The shapes of sections of the first extension 35a, the second extension 37a and the third extension 37b, and the distances therebetween are similar to those described with reference to FIG. 4, and thus detailed descriptions thereof will be omitted.

On the other hand, the connectors 36 electrically connect adjacent light emitting cells to each other. For example, the connectors 36 connect the first extension 35a of one light emitting cell to the second and third extensions 37a and 37b of other light emitting cells adjacent thereto. As clearly shown in FIG. 11B, the connector 36 may have one end placed on the first conductive type semiconductor layer 23 to be connected to the first extension 35a and the other end placed on the second conductive type semiconductor layer 27. As shown in FIG. 10, the other end of the connector 36 placed on the second conductive type semiconductor layer 27 is connected to the second and third extensions 37a and 37b.

Two connectors 36 are disposed near corners of the remaining light emitting cell (for example, C2) in the diagonal direction, excluding the first light emitting cell C1 and the third light emitting cell (C3, the last light emitting cell). The connector 36 connected to the first light emitting cell C1 is disposed near one corner of the light emitting cell in the diagonal direction so as to face the first electrode pad 35, and the connector 36 connected to the third light emitting cell C3 is disposed near another corner of the light emitting cell in the diagonal direction so as to face the second electrode pad 37. On the other hand, the first, second and third extensions 35a, 37a, and 37b on the first light emitting cell C1 have substantially similar shapes to the first, second and third extensions on the second light emitting cell C2 except that the first, second and third extensions are rotated 180 degrees with reference to an imaginary axis intersecting the light emitting cells C1 to C3, for example, a transverse axis parallel to line A-A of FIG. 10. The first, second and third extensions 35a, 37a, and 37b on the second light emitting cell C2 also have substantially similar shapes to the first, second and third extensions on the third light emitting cell C3 except that the first, second and third extensions are rotated 180 degrees with reference to the imaginary axis intersecting the light emitting cells C1 to C3. With the structure wherein the first to third extensions 35a, 37a, and 37b disposed on one light emitting cell are reversed to the corresponding first to third extensions on another light emitting cell adjacent thereto, the first extension 35a may be formed as a single line to have a relatively long length, and the second extension 37a and the third extension 37b may be formed to have substantially the same or similar length, whereby the light emitting diode can achieve substantially uniform current spreading at both sides of the first extension 35a.

In order to prevent disconnection between the first conductive type semiconductor layer 23 and the second conductive type semiconductor layer 27 in one light emitting cell by the connector 36, an insulation layer 39a may be formed under the connector 36. The insulation layer 39a may be formed of or include the same material, for example, $SiO_2$, as the current blocking layers 29, or may have a distributed Bragg reflector structure. The insulation layer 39a may be connected to the current blocking layers 29.

On the other hand, as shown in FIG. 11C and FIG. 12, an insulation layer 39b may cover side surfaces of the active layer 25 and the second conductive type semiconductor layer 27 exposed around the first electrode pad 35. The insulation layer 39b prevents bonding wires from being disconnected from the second conductive type semiconductor layer 27 or the active layer 25 upon wire bonding to the first electrode pad 35. In this exemplary embodiment, the insulation layer 39b has a ring shape having a cut portion through which the first extension 35a passes. However, it should be understood that other implementations are also possible. The insulation layer 39b may be formed in a ring shape so as to surround the first electrode pad 35 and the first extension 35a may pass above the insulation layer 39b.

Figure 13:
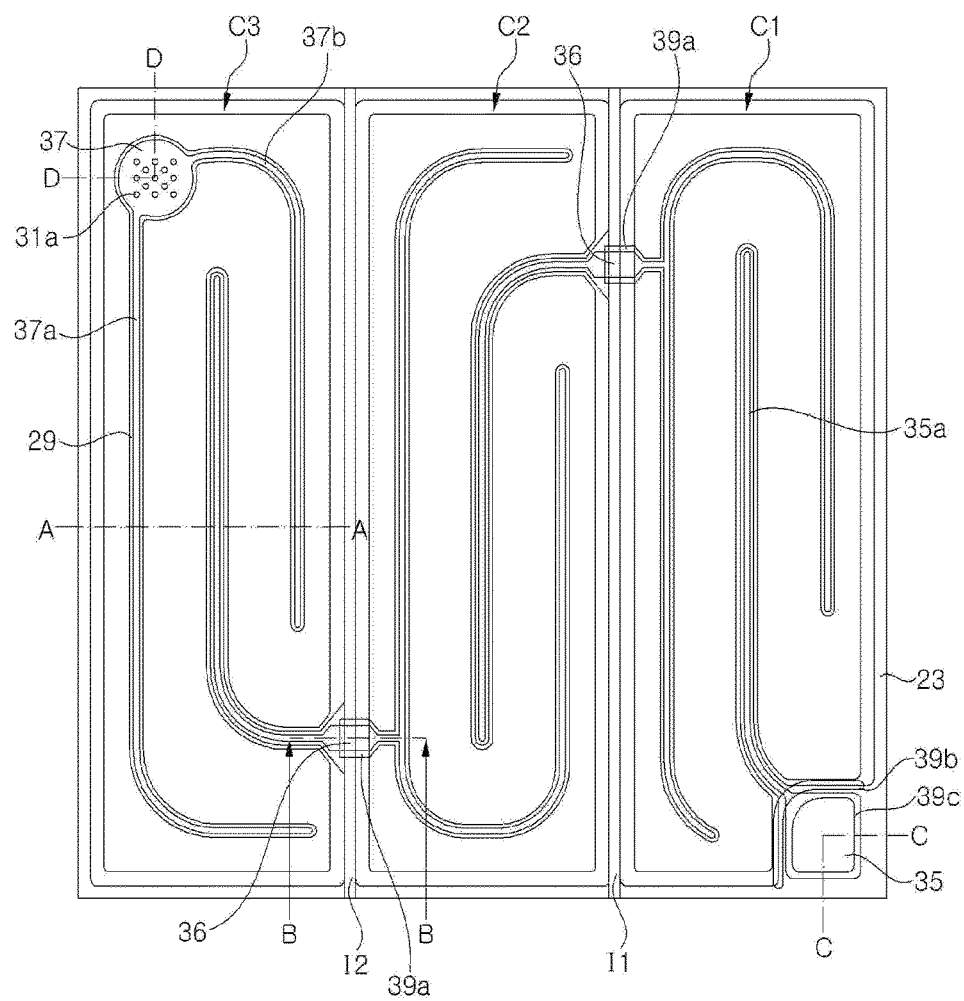
FIG. 13 is a plan view of a light emitting diode according to a sixth exemplary embodiment of the present disclosure.
Figure 14A:
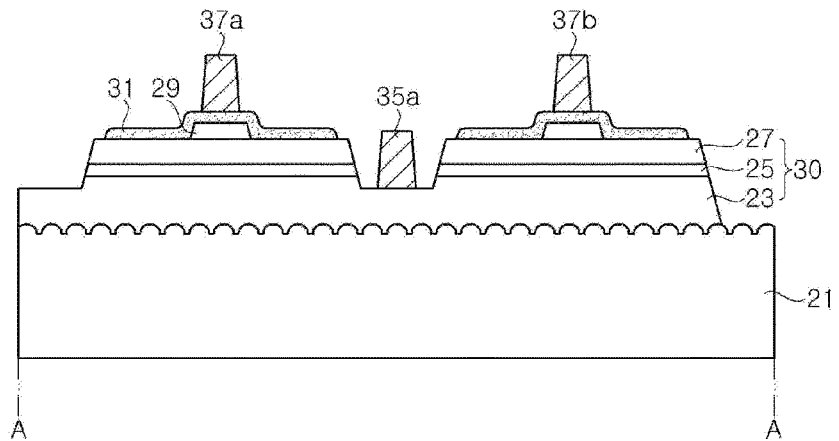
FIG. 14A, FIG. 14B, FIG. 14C and FIG. 14D are schematic cross-sectional views taken along lines A-A, B-B, C-C and D-D of FIG. 13, respectively.
Figure 14B:
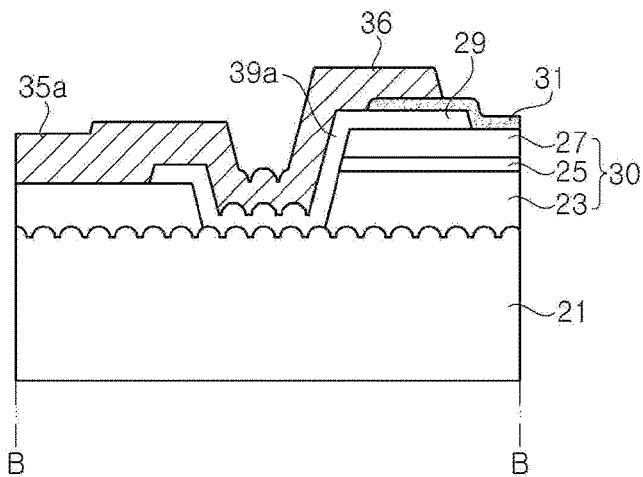
Figure 14C:
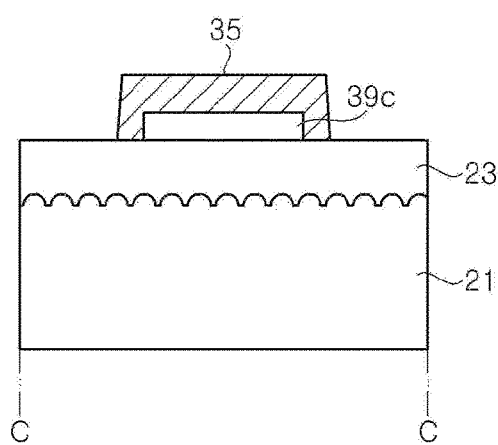
Figure 14D:
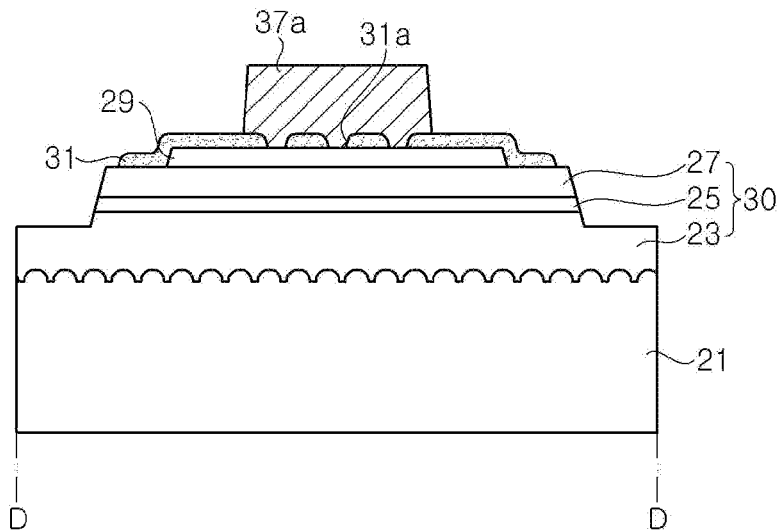
Figure 15:
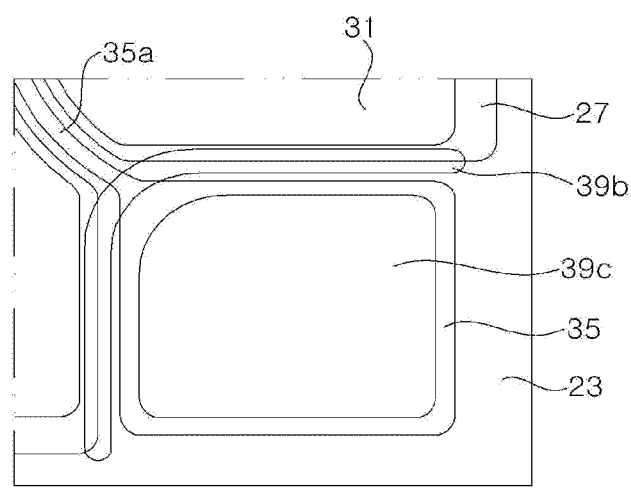
FIG. 15 is an enlarged plan view of a first electrode pad shown in FIG. 13.

FIG. 13 is a plan view of a light emitting diode according to a sixth exemplary embodiment of the present disclosure, FIG. 14A, FIG. 14B, FIG. 14C and FIG. 14D are schematic cross-sectional views taken along lines A-A, B-B, C-C and D-D of FIG. 13, respectively, and FIG. 15 is an enlarged plan view of a first electrode pad shown in FIG. 13.

Referring to FIG. 13, FIG. 14A, FIG. 14B, FIG. 14C and FIG. 14D, the light emitting diode according to this exemplary embodiment is generally similar to the light emitting diode according to the first exemplary embodiment and the following description will focus on different features of this exemplary embodiment.

As in the fifth exemplary embodiment, the light emitting structure according to this exemplary embodiment is divided into light emitting cells C1, C2, and C3 by cell isolation regions I1 and I2. Here, both sidewalls of each of the cell isolation regions I1 and I2 are formed by photolithography and etching and have relatively gentle inclinations in consideration of reliability of connectors 36 (see a right side surface of the light emitting structure 30 in FIG. 14A).

However, side surfaces of the substrate 21 may be subjected to laser scribing (see a left side surface of the substrate 21 in FIG. 14A) unlike the cell isolation regions I1 and I2, and thus have relatively sharp inclinations. For example, the substrate 21 and the first conductive type semiconductor layer 23 may be simultaneously separated from other light emitting diodes by laser scribing, whereby the side surfaces of the substrate 21 and the first conductive type semiconductor layer 23 may be linearly aligned with each other.

Unlike the fifth exemplary embodiment, the first electrode pad 35 according to this exemplary embodiment is placed closer to a corner of the substrate than an imaginary line connecting the distal ends of the second extension 37a and the third extension 37b. This structure is similar to the structure of the exemplary embodiment shown in FIG. 9.

In some implementations, a current blocking layer 39c may be disposed under the first electrode pad 35. The current blocking layer 39c contributes to current spreading by preventing direct flow of electric current from the first electrode pad 35 to the first conductive type semiconductor layer 23. As show in FIG. 14C, the current blocking layers 39c may be disposed under some region of the first electrode pad 35. Thus, an edge region of the first electrode pad 35 may be connected to the first conductive type semiconductor layer 23. A contact area between the first electrode pad 35 and the first conductive type semiconductor layer 23 may be adjusted by adjusting the widths of the current blocking layer 39c and the first electrode pad 35, thereby enabling control of forward voltage.

In this exemplary embodiment, the insulation layer 39b is formed to cover the sidewalls of the second conductive type semiconductor layer 27 and the active layer 25 around the first electrode pad 35. Unlike the fifth exemplary embodiment, since the first electrode pad 35 is disposed near the corner of the substrate in this exemplary embodiment, the insulation layer 39b does not have a ring shape. In addition, although the insulation layer 39b may be cut so as to allow the first extension 35a to pass therethrough in this exemplary embodiment, the insulation layer 39b may be formed in a continuous curved shape such that the first extension 35a passes above the insulation layer 39b, as shown in FIG. 15.

Furthermore, the structures of the current blocking layer 29 under the second electrode pad 37 and the transparent electrode layer 31 are different from those of the fifth exemplary embodiment. In the above exemplary embodiments, the current blocking layer 29 under the second electrode pad 37 includes, for example, the outer current blocking layer formed in a ring shape and placed in an outer region and a central current blocking layer placed in a region surrounded by the outer current blocking ring, the current blocking layer 29 according to this exemplary embodiment has a single disc shape. Thus, the second conductive type semiconductor layer 27 under the current blocking layer 29 is not exposed to the outside.

The transparent electrode layer 31 covering the current blocking layer 29 includes a plurality of openings 31a (see FIG. 14D) exposing the current blocking layer 29. These openings are separated from one another and dispersed on the current blocking layer 29.

The second electrode pad 37 is restrictively disposed in an upper region of the current blocking layer 29 and contacts the current blocking layer 29 through the openings of the transparent electrode layer 31. A contact area between the second electrode pad 37 and the current blocking layer 29 is increased by the openings formed in the transparent electrode layer 31 and the second electrode pad 37 is bonded to the transparent electrode layer 31 and the current blocking layer 29, thereby improving bonding strength of the second electrode pad 37.

Figure 16:
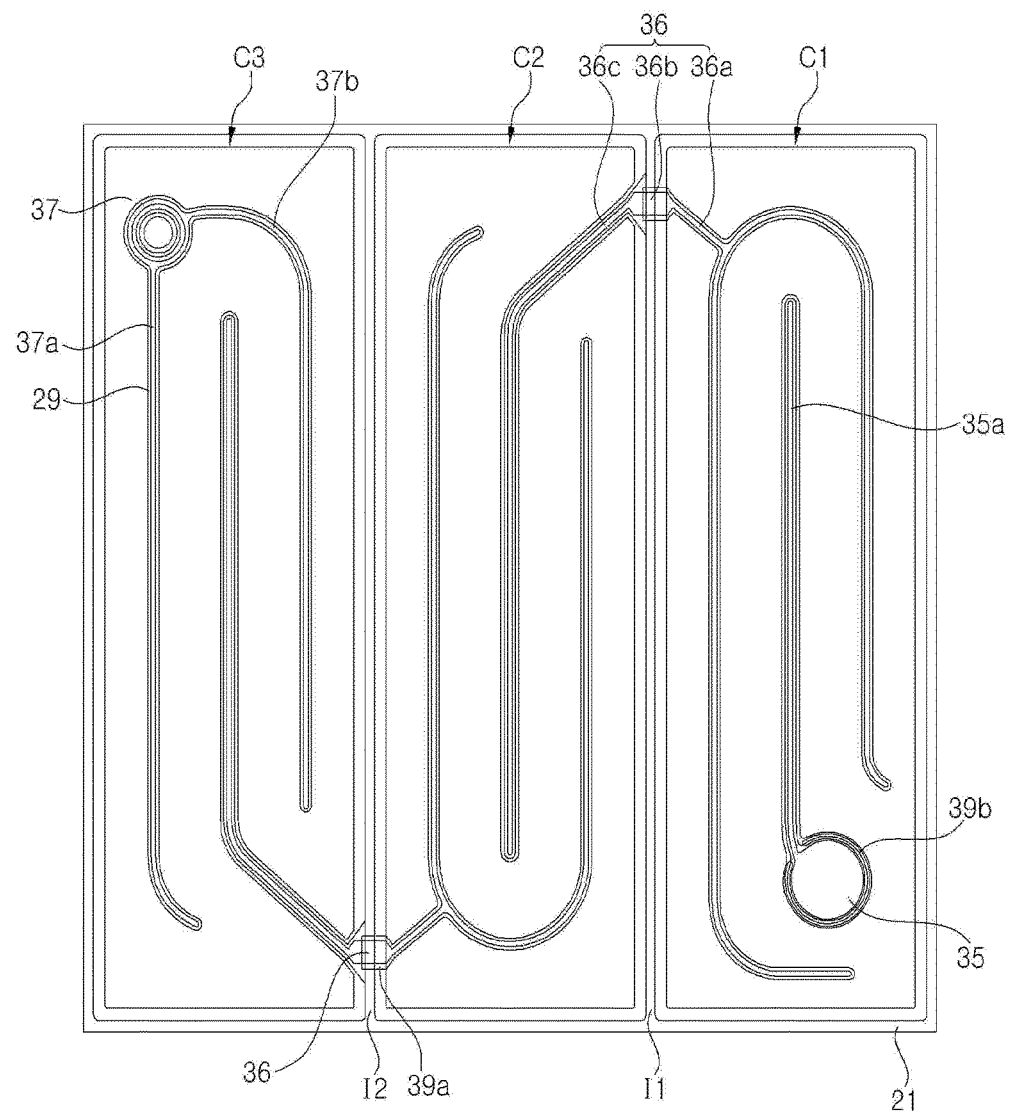
FIG. 16 is a plan view of a light emitting diode according to a seventh exemplary embodiment of the present disclosure.

FIG. 16 is a plan view of a light emitting diode according to a seventh exemplary embodiment of the present disclosure.

The light emitting diode according to this exemplary embodiment is generally similar to the light emitting diode described with reference to FIG. 10 and thus the following description will focus on modified features of this exemplary embodiment.

Referring to FIG. 16, the light emitting diode according to this exemplary embodiment is similar to the light emitting diodes according to the above exemplary embodiments in that the light emitting diode according to this exemplary embodiment includes connectors 36 connecting a first extension 35 on one light emitting cell (for example, C1) to second and third extensions 37a and 37b on another light emitting cell (for example, C2) adjacent thereto. However, according to this exemplary embodiment, the connectors 36 have a different shape from those of the light emitting diode according to the fifth exemplary embodiment. The connectors 36 may include a portion 36a connected to the second and third extensions 37a and 37b on one light emitting cell, a portion 36b disposed in an isolation region I1, and a portion 36c disposed on another light emitting cell adjacent thereto and connected to the first extension 35a. In FIG. 16, two connectors 36 having the same shape are disposed in the diagonal direction. The portion 36c connected to the first extension 35a may be defined as a linear section extending from a curved section of the first extension 35a to the isolation region I1 or I2 and the portion 36a connected to the second and third extensions 37a and 37b may be defined as a linear section extending from the isolation region I1 or I2 to the second and third extensions 37a and 37b. In the fifth exemplary embodiment, the connectors 36 are generally placed on a linear portion parallel to a minor axis direction of the light emitting cells C1, C2 and C3. Accordingly, the curved section of the third extension 37b connected to the connector 36 is disposed closer to one side edge of the light emitting cell C1 or C2 than the connectors 36. In this exemplary embodiment, the connector 36 includes linear portions inclined in the minor axis direction of the light emitting cell. In some implementations, the portion 36a of the connector disposed on the light emitting cell and connected to the second and third extensions 37a and 37b may be an inclined linear portion. Further, the portion 36c of the connector disposed on the light emitting cell and connected to the first extension 35a may also form an inclined linear portion. Accordingly, the connector 36 may be formed in a V shape, as shown in FIG. 16.

With the structure of the connector 36 as described above, the portion 36b of the connector 36 may be disposed as close as possible to the corner of each of the light emitting cells, and thus, the shortest distance between the connector 36 and the one side edge of the light emitting cell C1 or C2 may be shorter than the shortest distance between the third extension 37b and the one side edge of the light emitting cell C1 or C2. The connectors 36 disposed on the light emitting cells C1, C2, and C3 can contribute to current spreading like the first extension 35a, the second extension 37a and the third extension 37b, and the portion of the connector disposed near the corner of the light emitting cell spreads electric current towards the corner of the light emitting cell, thereby improving luminous efficacy.

Figure 17:
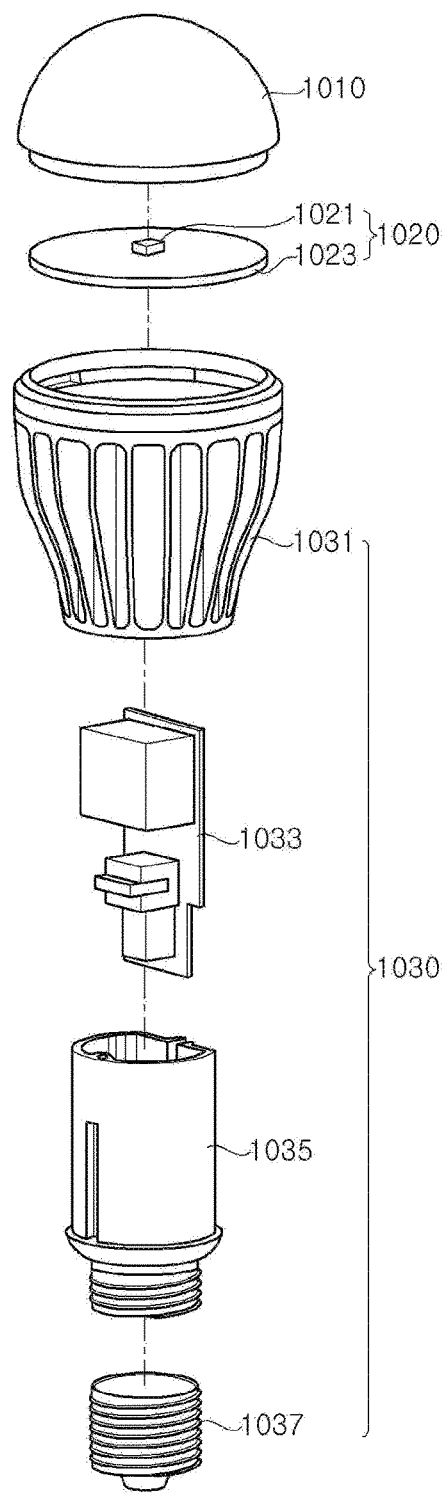
FIG. 17 is an exploded perspective view of a lighting apparatus to which a light emitting diode according to one exemplary embodiment of the present disclosure is applied.

FIG. 17 is an exploded perspective view of a lighting apparatus to which a light emitting diode according to one exemplary embodiment of the present disclosure is applied.

Referring to FIG. 17, the lighting apparatus according to this embodiment includes a diffusive cover 1010, a light emitting diode module 1020, and a body 1030. The body 1030 may receive the light emitting diode module 1020 and the diffusive cover 1010 may be disposed on the body 1030 to cover an upper side of the light emitting diode module 1020.

The body 1030 may have any shape so long as the body can supply electric power to the light emitting diode module 1020 while receiving and supporting the light emitting diode module 1020. For example, as shown in the drawing, the body 1030 may include a body case 1031, a power supply 1033, a power supply case 1035, and a power source connection 1037.

The power supply 1033 is received in the power supply case 1035 to be electrically connected to the light emitting diode module 1020, and may include at least one IC chip. The IC chip may regulate, change or control electric power supplied to the light emitting diode module 1020. The power supply case 1035 may receive and support the power supply 1033, and the power supply case 1035 having the power supply 1033 secured therein may be disposed within the body case 1031. The power source connection 1037 is disposed at a lower end of the power supply case 1035 and is coupled thereto. Accordingly, the power source connection 1037 is electrically connected to the power supply 1033 within the power supply case 1035 and may serve as a passage through which power can be supplied from an external power source to the power supply 1033.

The light emitting diode module 1020 includes a substrate 1023 and a light emitting diode 1021 disposed on the substrate 1023. The light emitting diode module 1020 may be disposed at an upper portion of the body case 1031 and electrically connected to the power supply 1033.

As the substrate 1023, any substrate capable of supporting the light emitting diode 1021 may be used without limitation. For example, the substrate 1023 may include a printed circuit board having interconnects formed thereon. The substrate 1023 may have a shape corresponding to a securing portion formed at the upper portion of the body case 1031 so as to be stably secured to the body case 1031. The light emitting diode 1021 may include at least one of the light emitting diodes according to the exemplary embodiments described above.

The diffusive cover 1010 is disposed on the light emitting diode 1021 and may be secured to the body case 1031 to cover the light emitting diode 1021. The diffusive cover 1010 may be formed of or include a light-transmitting material and light orientation of the lighting apparatus may be adjusted through regulation of the shape and optical transmissivity of the diffusive cover 1010. Thus, the diffusive cover 1010 may be modified in various shapes depending on usage and applications of the lighting apparatus.

Figure 18A:
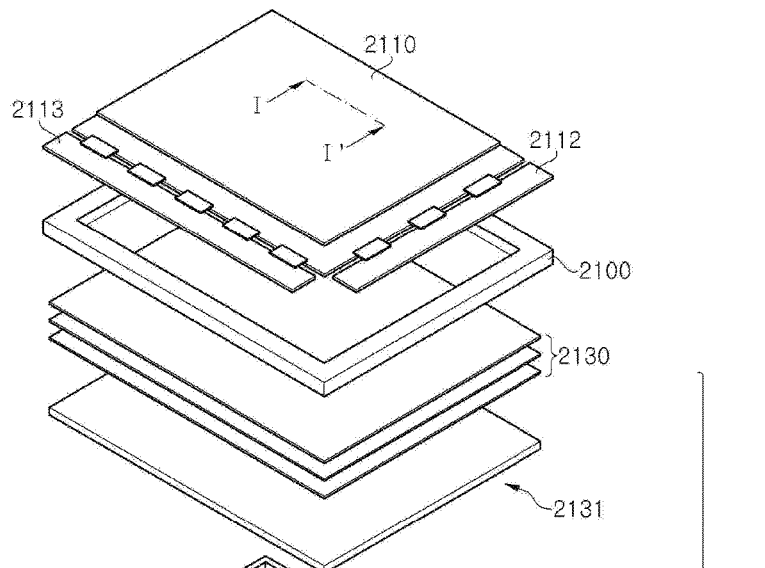
FIG. 18A and FIG. 18B are cross-sectional views of one example of a display apparatus to which a light emitting diode according to one exemplary embodiment of the present disclosure is applied.
Figure 18B:
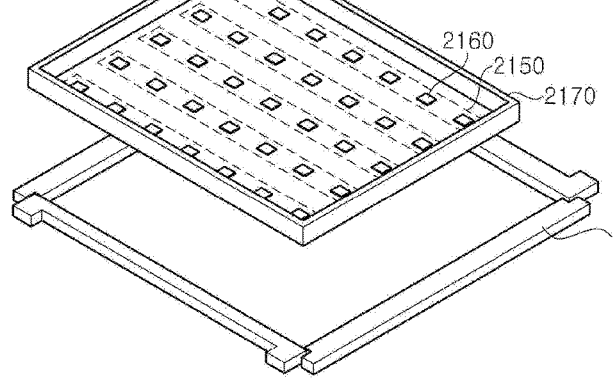
Figure 18B:
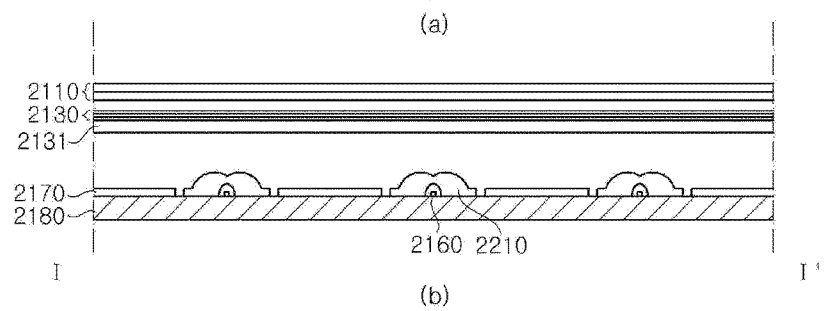

FIG. 18A and FIG. 18B are cross-sectional views of one example of a display apparatus to which a light emitting diode according to one exemplary embodiment of the present disclosure is applied.

The display according to this embodiment includes a display panel 2110, a backlight unit BLU1 supplying light to the display panel 2110, and a panel guide 2100 supporting a lower edge of the display panel 2110.

The display panel 2110 is not particularly limited and may be or include, for example, a liquid crystal panel including a liquid crystal layer. Gate driving PCBs may be further disposed at the periphery of the display panel 2110 to supply driving signals to a gate line. Here, the gate driving PCBs 2112 and 2113 may be formed on a thin film transistor substrate instead of being formed on separate PCBs.

The backlight unit BLU1 includes a light source module, which includes at least one substrate 2150 and a plurality of light emitting diodes 2160. The backlight unit BLU1 may further include a bottom cover 2180, a reflective sheet 2170, a diffusive plate 2131, and optical sheets 2130.

The bottom cover 2180 may be open at an upper side thereof to receive the substrate 2150, the light emitting diodes 2160, the reflective sheet 2170, the diffusive plate 2131, and the optical sheets 2130. In addition, the bottom cover 2180 may be coupled to the panel guide 2100. The substrate 2150 may be disposed under the reflective sheet 2170 to be surrounded by the reflective sheet 2170. Alternatively, when a reflective material is coated on a surface thereof, the substrate 2150 may be disposed on the reflective sheet 2170. Further, a plurality of substrates 2150 may be arranged parallel to one other, without being limited thereto. However, it should be understood that the light source module may include a single substrate.

The light emitting diodes 2160 may include at least one of the light emitting diodes according to the exemplary embodiments described above. The light emitting diodes 2160 may be regularly arranged in a predetermined pattern on the substrate 2150. In addition, a lens 2210 may be disposed on each of the light emitting diodes 2160 to improve uniformity of light emitted from the plurality of light emitting diodes 2160.

The diffusive plate 2131 and the optical sheets 2130 are disposed on the light emitting diode 2160. Light emitted from the light emitting diode 2160 may be supplied in the form of sheet light to the display panel 2110 through the diffusive plate 2131 and the optical sheets 2130.

In this way, the light emitting diodes according to the exemplary embodiments may be applied to direct type displays like the display according to this embodiment.

Figure 19A:
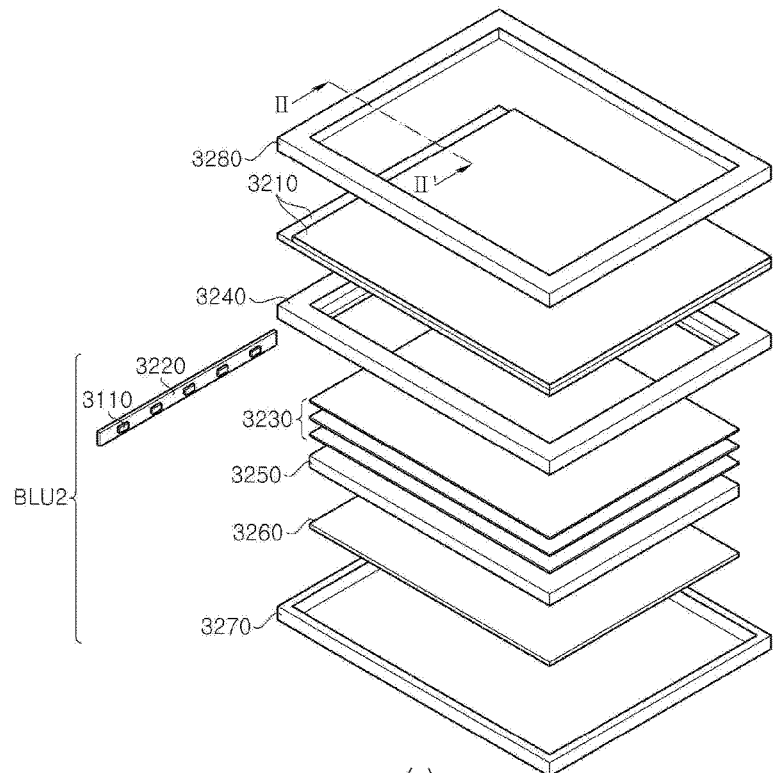
FIG. 19A and FIG. 19B are cross-sectional views of another example of the display apparatus to which the light emitting diode according to one exemplary embodiment of the present disclosure is applied.
Figure 19B:
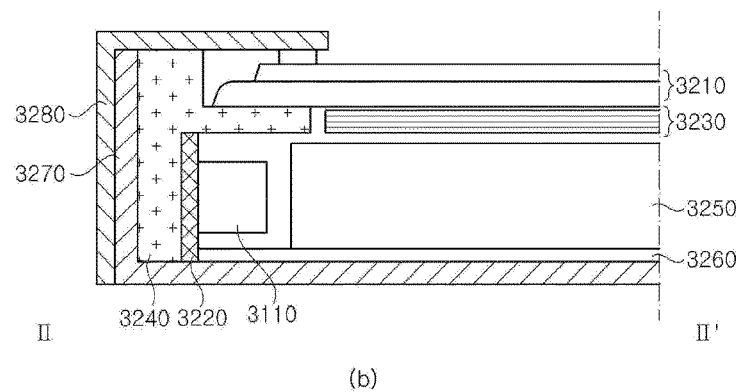

FIG. 19A and FIG. 19B are cross-sectional views of another example of the display apparatus to which the light emitting diode according to the exemplary embodiment of the present disclosure is applied.

The display according to this exemplary embodiment includes a display panel 3210 on which an image is displayed, and a backlight unit BLU2 disposed at a rear side of the display panel 3210 and emitting light thereto. Further, the display includes a frame 240 supporting the display panel 3210 and receiving the backlight unit BLU2, and covers 3240 and 3280 surrounding the display panel 3210.

The display panel 3210 is not particularly limited and may be or include, for example, a liquid crystal panel including a liquid crystal layer. A gate driving PCB may be further disposed at the periphery of the display panel 3210 to supply driving signals to a gate line. Here, the gate driving PCB may be formed on a thin film transistor substrate instead of being formed on a separate PCB. The display panel 3210 is secured by the covers 3240 and 3280 disposed at upper and lower sides thereof, and the cover 3280 disposed at the lower side of the display panel 3210 may be coupled to the backlight unit BLU2.

The backlight unit BLU2 supplying light to the display panel 3210 includes a lower cover 3270 partially open at an upper side thereof, a light source module disposed at one side inside the lower cover 3270, and a light guide plate 3250 disposed parallel to the light source module and converting spot light into sheet light. In addition, the backlight unit BLU2 according to this exemplary embodiment may further include optical sheets 3230 disposed on the light guide plate 3250 to spread and collect light, and a reflective sheet 3260 disposed at a lower side of the light guide plate 3250 and reflecting light traveling in a downward direction of the light guide plate 3250 towards the display panel 3210.

The light source module includes a substrate 3220 and a plurality of light emitting diodes 3110 arranged at constant intervals on one surface of the substrate 3220. As the substrate 3220, any substrate capable of supporting the light emitting diodes 3110 and being electrically connected thereto may be used without limitation. For example, the substrate 3220 may include a printed circuit board. The light emitting diodes 3110 may include at least one of the light emitting diodes according to the exemplary embodiments described above. Light emitted from the light source module enters the light guide plate 3250 and is supplied to the display panel 3210 through the optical sheets 3230. The light guide plate 3250 and the optical sheets 3230 convert spot light emitted from the light emitting diodes 3110 into sheet light.

In this way, the light emitting diodes according to the exemplary embodiments may be applied to edge type displays like the display according to this exemplary embodiment.

Figure 20:
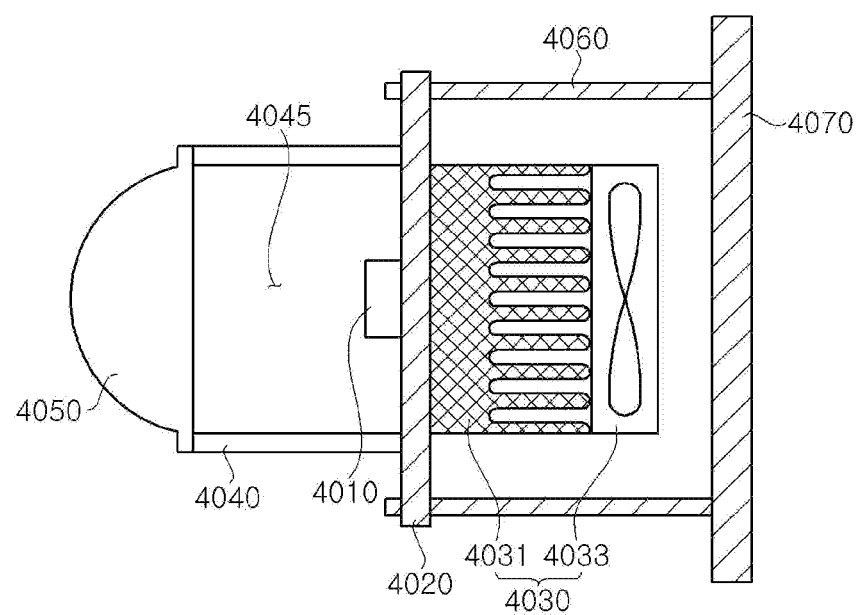
FIG. 20 is a cross-sectional view of a headlight to which a light emitting diode according to one exemplary embodiment of the present disclosure is applied.

FIG. 20 is a cross-sectional view of a headlight to which a light emitting diode according to one exemplary embodiment of the present disclosure is applied.

Referring to FIG. 20, the headlight according to this exemplary embodiment includes a lamp body 4070, a substrate 4020, a light emitting diode 4010, and a cover lens 4050. The headlight may further include a heat dissipation unit 4030, a support rack 4060, and a connection member 4040.

The substrate 4020 is secured by the support rack 4060 and is disposed above the lamp body 4070. As the substrate 4020, any member capable of supporting the light emitting diode 4010 may be used without limitation. For example, the substrate 4020 may include a substrate having a conductive pattern, such as a printed circuit board. The light emitting diode 4010 is disposed on the substrate 4020 and may be supported and secured by the substrate 4020. In addition, the light emitting diode 4010 may be electrically connected to an external power source through the conductive pattern of the substrate 4020. Further, the light emitting diode 4010 may include at least one of the light emitting diodes according to the exemplary embodiments described above.

The cover lens 4050 is disposed on a path of light emitted from the light emitting diode 4010. For example, as shown in the drawing, the cover lens 4050 may be spaced apart from the light emitting diode 4010 by the connection member 4040 and may be disposed in a direction of supplying light emitted from the light emitting diode 4010. By the cover lens 4050, an orientation angle and/or a color of light emitted by the headlight can be adjusted. On the other hand, the connection member 4040 is disposed to secure the cover lens 4050 to the substrate 4020 while surrounding the light emitting diode 4010, and thus may act as a light guide that provides a luminous path 4045. The connection member 4040 may be formed of or include a light reflective material or coated therewith. On the other hand, the heat dissipation unit 4030 may include heat dissipation fins 4031 and/or a heat dissipation fan 4033 to dissipate heat generated upon operation of the light emitting diode 4010.

In this way, the light emitting diodes according to the exemplary embodiment may be applied to headlights, for example, headlights for vehicles, like the headlight according to this embodiment.

Although certain exemplary embodiments and implementations have been described herein, it should be understood that these exemplary embodiments are provided for illustration only. Therefore, the following embodiments are not to be construed as limiting the present disclosure and the present disclosure should be limited only by the claims and equivalents thereof.

What is claimed is:
1. A light emitting device comprising:
   a substrate including a first to fourth corners, the first corner and the second corner disposed in a direction along an edge of the substrate and the third corner and the forth corner disposed in the direction along another edge of the substrate opposite to the edge of the substrate;
   a first to third light emitting cells that are disposed on the substrate and sequentially arranged along the direction, each light emitting cell including a first conductive type semiconductor layer, a second conductive type semiconductor layer disposed on the first conductive type semiconductor layer, and an active layer interposed between the first conductive type semiconductor layer and the second conductive type semiconductor layer;
   a first electrode pad disposed in the first light emitting cell and electrically connected to the first conductivity type semiconductor layer of the first light emitting cell, the first electrode pad located closer to the first corner than the second to fourth corners;
   a second electrode pad disposed in the third light emitting cell and electrically connected to the second conductivity type semiconductor layer of the third light emitting cell, the second electrode pad located closer to the third corner than the first, second and fourth corners;

a first connector connecting the first light emitting cell to the second light emitting cell and disposed closer to the fourth corner than the first, the second and the third corners;

a second connector connecting the second light emitting cell to the third light emitting cell and disposed closer to the second corner than the first, the third and the fourth corners; and an insulation layer formed above the substrate and under the second connector, wherein a surface of the second connector and a surface of the insulation layer include a pattern corresponding to a shape of an upper surface of the substrate, wherein the second light emitting cell includes a second extension and a third extension that are electrically connected to the second conductivity type semiconductor layer of the second light emitting cell, wherein the insulation layer comprises a first portion under the second connector and second portion under the second and the third extension, and wherein a width of the first portion is wider than a width of the second portion and the third extension.

2. The light emitting device of claim 1, wherein the first electrode pad and the second electrode pad are arranged in a diagonal direction.

3. The light emitting device of claim 1, wherein the first connector and the second connector are arranged in a diagonal direction.

4. The light emitting device of claim 1, wherein the first light emitting cell further includes a first extension extending from the first electrode pad, and a second extension and a third extension that are disposed on opposite sides of the first extension.

5. The light emitting device of claim 4, wherein the first connector connects the second and third extensions of the first light emitting cell to the second light emitting cell.

6. The light emitting device of claim 4, wherein the first electrode pad is disposed closer to a longitudinal central axis of the first light emitting cell than an imaginary line connecting ends of the second extension and the third extension.

7. The light emitting device of claim 1, wherein the third light emitting cell further includes a second extension and a third extension that extend from the second electrode pad and a first extension disposed between the second extension and the third extension.

8. The light emitting device of claim 7, wherein the second connector connects the first extension of the third light emitting cell to the second light emitting cell.

9. The light emitting device of claim 1, wherein the second light emitting cell further includes a first extension disposed on the first conductivity type semiconductor layer of the second light emitting cell and between the second extension and the third extension.

10. The light emitting device of claim 1, wherein the insulation layer includes a distributed Bragg reflector structure.

11. A light emitting device comprising:

a first light emitting cell including a first conductive type semiconductor layer, a second conductive type semiconductor layer disposed on the first conductive type semiconductor layer, an active layer interposed between the first and second conductive type semiconductor layers, and a first electrode pad electrically connected to the first conductivity type semiconductor layer of the first light emitting cell;

a second light emitting cell disposed adjacent to the first light emitting cell and including a first conductive type semiconductor layer, a second conductive type semiconductor layer disposed on the first conductive type semiconductor layer of the second light emitting cell, and an active layer interposed between the first and second conductive type semiconductor layers of the second light emitting cell;

a third light emitting cell disposed adjacent to the second light emitting cell and including a first conductive type semiconductor layer, a second conductive type semiconductor layer disposed on the first conductive type semiconductor layer of the third light emitting cell, an active layer interposed between the first and second conductive type semiconductor layers of the third light emitting cell, and a second electrode pad electrically connected to the second conductivity type semiconductor layer of the third light emitting cell, wherein the second electrode pad and the first electrode pad are arranged in a first diagonal direction;

a first connector connecting the first light emitting cell to the second light emitting cell; and a second connector connecting the second light emitting cell to the third light emitting cell, wherein the first connector and the second connector are disposed in a second diagonal direction different from the first diagonal direction; and a first insulation layer formed above the substrate and under the second connector, and wherein a surface of the second connector and a surface of the insulation layer include a pattern;

wherein the light emitting device further includes a second insulation layer covering side surfaces of the active layer and the second conductive type semiconductor layer located around the first electrode pad.

12. The light emitting device of claim 11, wherein the first electrode pad is disposed closer to a first corner of the first light emitting cell than other corners of the first light emitting cell.

13. The light emitting device of claim 12, wherein the first connector is disposed closer to a second corner of the first light emitting cell than other corners of the first light emitting cell, the second corner and the first corner positioned diagonally opposite to each other.

14. The light emitting device of claim 11, wherein the second electrode pad is disposed closer to a first corner of the third light emitting cell than other corners of the third light emitting cell.

15. The light emitting device of claim 14, wherein the second connector is disposed closer to a second corner of the third light emitting cell than other corners of the third light emitting cell, the second corner and the first corner positioned diagonally opposite to each other.

16. The light emitting device of claim 11, the first light emitting cell further includes a first extension extending from the first electrode pad, and a second extension and a third extension disposed on opposite sides of the first extension.

17. The light emitting device of claim 16, wherein the first connector connects the second and the third extensions of the first light emitting cell to the second light emitting cell.

18. The light emitting device of claim 16, wherein the first electrode pad is disposed closer to a longitudinal central axis of the first light emitting cell than an imaginary line connecting ends of the second extension and the third extension.

19. The light emitting device of claim 11, wherein the third light emitting cell further includes a second extension and a third extension that extend from the second electrode pad and a first extension disposed between the second extension and the third extension.

20. The light emitting device of claim 19, wherein the second connector connects the first extension of the third light emitting cell to the second light emitting cell.

21. The light emitting device of claim 11, wherein the second light emitting cell further includes a second extension and a third extension that are electrically connected to the second conductivity type semiconductor layer of the second light emitting cell and a first extension disposed between the second extension and the third extension.

* * * * *